US011451420B2

(12) United States Patent
Niu et al.

(10) Patent No.: US 11,451,420 B2
(45) Date of Patent: Sep. 20, 2022

(54) DATA TRANSMISSION METHOD, COMMUNICATIONS DEVICE, AND STORAGE MEDIUM

(71) Applicant: HUAWEI TECHNOLOGIES CO., LTD., Guangdong (CN)

(72) Inventors: Xiangping Niu, Nanjing (CN); Lei Han, Nanjing (CN); Yinliang Hu, Nanjing (CN); Hanyu Wei, Nanjing (CN); Duoliang Fan, Nanjing (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 0 days.

(21) Appl. No.: 17/159,945

(22) Filed: Jan. 27, 2021

(65) Prior Publication Data

US 2021/0152406 A1 May 20, 2021

Related U.S. Application Data

(63) Continuation of application No. PCT/CN2019/104749, filed on Sep. 6, 2019.

(30) Foreign Application Priority Data

Sep. 28, 2018 (CN) .......................... 201811142515.X

(51) Int. Cl.
*H04L 25/14* (2006.01)
*H04J 3/16* (2006.01)
*H04L 47/30* (2022.01)

(52) U.S. Cl.
CPC ............ *H04L 25/14* (2013.01); *H04J 3/1652* (2013.01); *H04L 47/30* (2013.01); *H04J 2203/0085* (2013.01)

(58) Field of Classification Search
CPC ........ H04L 25/14; H04L 47/30; H04J 3/1653; H04J 2203/0085
See application file for complete search history.

(56) References Cited

U.S. PATENT DOCUMENTS 8,547,829 B1 * 10/2013 Shah ..................... H04W 76/12
370/217
8,958,337 B1 * 2/2015 Ramanathan ........... H04L 41/00
370/254

(Continued)

FOREIGN PATENT DOCUMENTS

CN 106301678 A 1/2017
CN 106330630 A 1/2017

(Continued)

OTHER PUBLICATIONS

Optical Internetworking Forum et al., Flex Ethernet 2.0 Implementation Agreement, Jun. 22, 2018, total:51pages.

*Primary Examiner* — Brenda H Pham
(74) *Attorney, Agent, or Firm* — Womble Bond Dickinson (US) LLP

(57) ABSTRACT

Embodiments of this application provide a data transmission method, a communications device, and a storage medium, to reduce pressure caused by a quantity of cross connections between intermediate nodes to the intermediate nodes in a network. In an embodiment of this application, a first communications device obtains Q first code block streams, and obtains a to-be-sent second code block stream based on the Q first code block streams. Q downlink ports are in a one-to-one correspondence with the Q first code block streams, the Q downlink ports correspond to S code block groups, one code block in the Q first code block streams corresponds to one code block group, and the second code block stream obtained by the first communications device includes L code block sets; and for each of the L code block (Continued)

sets, the code block set includes K code blocks corresponding to each of the S code block groups. In the solutions provided in this embodiment of this application, code block streams are multiplexed at a code block granularity, so that a quantity of cross connections between intermediate nodes in a network can be reduced, thereby reducing pressure on network management and operation and maintenance.

18 Claims, 14 Drawing Sheets

(56) References Cited

U.S. PATENT DOCUMENTS

| | | | | |
|---|---|---|---|---|
| 9,007,941 | B1* | 4/2015 | Miclea | H04L 29/0621 |
| | | | | 370/252 |
| 9,288,148 | B1* | 3/2016 | Krishnaswamy | H04L 41/0893 |
| 2002/0075903 | A1* | 6/2002 | Hind | H04J 3/1611 |
| | | | | 370/503 |
| 2016/0094311 | A1 | 3/2016 | Su et al. | |
| 2017/0289045 | A1 | 10/2017 | Renner et al. | |
| 2018/0042003 | A1* | 2/2018 | Chen | H04W 76/10 |
| 2018/0083736 | A1 | 3/2018 | Manolakos et al. | |

FOREIGN PATENT DOCUMENTS

| | | |
|---|---|---|
| CN | 106341207 A | 1/2017 |
| CN | 106411454 A | 2/2017 |
| CN | 106612203 A | 5/2017 |
| CN | 106712899 A | 5/2017 |
| CN | 107438029 A | 12/2017 |
| CN | 108243128 A | 7/2018 |
| EP | 3113502 A1 | 1/2017 |
| KR | 20150022859 A | 3/2015 |
| WO | 2018121224 A1 | 7/2018 |
| WO | 2018149177 A1 | 8/2018 |

* cited by examiner

DATA TRANSMISSION METHOD, COMMUNICATIONS DEVICE, AND STORAGE MEDIUM

CROSS-REFERENCE TO RELATED APPLICATION

This application is a continuation of International Application No. PCT/CN2019/104749, filed on Sep. 6, 2019, which claims priority to Chinese Patent Application No. 201811142515.X, filed on Sep. 28, 2018. The disclosures of the aforementioned applications are hereby incorporated by reference in their entireties.

TECHNICAL FIELD

This application relates to the communications field, and in particular, to a data transmission method, a communications device, and a storage medium.

BACKGROUND

The optical internetworking forum (OIF) publishes flexible Ethernet (FlexE), and the FlexE is a general technology supporting a plurality of Ethernet MAC layer rates. A plurality of 100 GE (Physical, PHYs) ports are bound, and each 100 GE port is divided into 20 slots by using 5 G as a granularity in time domain, so that the FlexE may support the following functions: Binding: A plurality of Ethernet ports are bound into one link group to support a medium access control (MAC) service whose rate is greater than that of a single Ethernet port. Sub-rate: A MAC service whose rate is less than a link group bandwidth or is less than a signal Ethernet port bandwidth is supported by allocating a slot to the service. Channelization: Simultaneous transmission of a plurality of MAC services in a link group is supported by allocating slots to the services. For example, simultaneous transmission of one 150 G MAC service and two 25 G MAC services is supported in a 2×100 GE link group.

The FlexE divides slots in a time division multiplexing (TDM) manner, to implement hard isolation of bandwidth of a transmission pipeline. One service data stream may be assigned to one or more slots, to implement matching of services with various rates. One FlexE group (which may also be referred to as a FlexE Group) may include one or more physical link interfaces (which may be written as a PHY). FIG. 1 is an example of a schematic diagram of a communications system that is based on the flexible Ethernet protocol. As shown in FIG. 1, for example, a FlexE group includes four PHYs. A flexible Ethernet protocol client (FlexE Client) represents a client data stream transmitted in a specified slot (one or more slots) on the FlexE group, and a plurality of FlexE clients may be carried on one FlexE group. One FlexE client corresponds to one user service data stream (where in this case, the FlexE client may be typically referred to as a medium access control (MAC) client). A flexible Ethernet protocol function layer (which may be referred to as FlexE Shim) provides data adaption and transformation from the FlexE client to the MAC client.

Huawei has released a new technology at an ITU-T IMT2020 workshop in December, 2016. This technical system may be briefly referred to as ubiquitous Ethernet (which may be referred to as X-Ethernet or X-E), and is a new-generation switch networking technology that is based on an Ethernet physical layer and that has a deterministic ultra-low latency feature. One of concepts of the ubiquitous Ethernet is switch networking that is based on a bit block) sequence, such as an unscrambled 64B/66B code block sequence or an equivalent 8B/10B code block sequence. The OIF FlexE defines slot (SLOT) granularities of 5 Gbps and 25 Gbps rates based on a 64B/66B code block (64B/66B for short below). Any FlexE client may be carried by allocating, on a FlexE-based NNI or UNI, several slots whose total bandwidth rate is a multiple of 5 Gbps or a multiple of 25 Gbps.

An intermediate node in the X-E network needs to parse and extract each FlexE client and perform switching processing, without consideration of hierarchical multiplexing. When an X-Ethernet flat networking technology is applied to end-to-end networking of a metropolitan area network and a backbone network, tens of thousands of dedicated-line services need to be scheduled between a plurality of cities, and aggregation devices and core devices need to manage hundreds of thousands of end-to-end cross connections, causing difficulties in management and operation and maintenance.

SUMMARY

Embodiments of this application provide a data transmission method, a communications device, and a storage medium, to reduce pressure caused by a quantity of cross connections between intermediate nodes to the intermediate nodes in a network, and to reduce pressure on network management and operation and maintenance.

According to a first aspect, an embodiment of this application provides a data transmission method. In the method, a first communications device obtains Q first code block streams, and obtains a to-be-sent second code block stream based on the Q first code block streams. Q is an integer greater than 1, Q downlink ports are in a one-to-one correspondence with the Q first code block streams, the Q downlink ports correspond to S code block groups, one downlink port corresponds to one or more code block groups, one code block in the Q first code block streams corresponds to one code block group, and S is an integer not less than Q; the second code block stream obtained by the first communications device includes L code block sets; and for each of the L code block sets, the code block set includes K code blocks corresponding to each of S code block groups, and L and K are each a positive integer. In the solutions provided in this embodiment of this application, code block streams are multiplexed at a code block granularity, so that a quantity of cross connections between intermediate nodes in a network can be reduced, thereby reducing pressure on network management and operation and maintenance.

In one embodiment of the first aspect, for a code block in the L code block sets, content carried in a synchronization header area of the code block in the second code block stream is the same as content carried in a synchronization header area of the code block in the Q first code block streams; and content carried in a non-synchronization header area of the code block in the second code block stream is the same as content carried in a non-synchronization header area of the code block in the Q first code block streams. In this way, a multiplexing process can be simplified. In addition, because the non-synchronization header area in the first code block stream does not need to be independently indicated by using indication information, a data volume of the indication information can be reduced, thereby reducing network load.

According to a second aspect, an embodiment of this application provides a data transmission method. In the method, a first communications device obtains Q first code block streams, where Q is an integer greater than 1; and the first communications device obtains a to-be-sent second code block stream based on the Q first code block streams, where for a code block, from the Q first code block streams, carried in the second code block stream, content carried in a synchronization header area of the code block in the second code block stream is the same as content carried in a synchronization header area of the code block in the Q first code block streams; and content carried in a non-synchronization header area of the code block in the second code block stream is the same as content carried in a non-synchronization header area of the code block in the Q first code block streams. In this way, code block streams can be multiplexed at a code block granularity, so that a quantity of cross connections between intermediate nodes in a network can be reduced, thereby reducing pressure on network management and operation and maintenance. In addition, a multiplexing process can be simplified. Further, because the non-synchronization header area in the first code block stream does not need to be independently indicated by using indication information, a data volume of the indication information can be reduced, thereby reducing network load.

In one embodiment of the second aspect, Q is an integer greater than 1, Q downlink ports are in a one-to-one correspondence with the Q first code block streams, the Q downlink ports correspond to S code block groups, one downlink port corresponds to one or more code block groups, one code block in the Q first code block streams corresponds to one code block group, and S is an integer not less than Q; the second code block stream obtained by the first communications device includes L code block sets; and for each of the L code block sets, the code block set includes K code blocks corresponding to each of S code block groups, and L and K are each a positive integer.

In one embodiment of the first aspect or the second aspect, when the first communications device is not a core device, a value of S is a total quantity of code block groups corresponding to the Q downlink ports in an uplink data transmission process, and each of the S code block groups is a code block group corresponding to the Q downlink ports in the uplink data transmission process. When the first communications device is a core device, a value of S is a total quantity of code block groups corresponding to the Q downlink ports in a downlink data transmission process, and each of the S code block groups is a code block group corresponding to the Q downlink ports in the downlink data transmission process. In other words, a quantity of code block groups allocated to Q downlink ports of a communications device in the uplink data transmission process may be the same as or different from a quantity of code block groups allocated to the Q downlink ports of the communications device in the uplink data transmission process. In addition, for a downlink port in the Q downlink ports of the communications device, a code block group allocated to the downlink port in the uplink data transmission process may be the same as or different from a code block group allocated to the downlink port in the uplink data transmission process, and a code block group allocated to a port may be marked by a code block group identifier or other identifier information allocated to the port, where the code block group identifier or the other identifier information can uniquely identify the code block group. In this way, flexibility of the solutions can be improved.

In one embodiment of the first aspect or the second aspect, one downlink port may correspond to one or more code block groups, but one code block group corresponds to only one downlink port. In this way, bandwidth can be allocated to the downlink port by using the code block group as a granularity, and because one code block group corresponds to only one downlink port, complexity can also be reduced when multiplexing or demultiplexing is performed.

In the first aspect or the second aspect, the downlink port may be a port that is on the communications device and that has a direct or indirect data transmission relationship with a terminal device side. Correspondingly, the communications device may further include an uplink port, and the uplink port is a port that is on the communications device and that has a direct or indirect data transmission relationship with a core device side. In subsequent embodiments, descriptions may be made by using examples with reference to the accompanying drawings.

In one embodiment of the first aspect or the second aspect, after the first communications device obtains the to-be-sent second code block stream, when needing to send the second code block stream by using an uplink port, the first communications device may send the second code block stream by using one or more uplink ports. The following provides descriptions of two cases. In a first case, the second code block stream is sent by using a plurality of uplink ports. In this case, a data unit may be used as a granularity of the second code block stream, and data units are sent in a sequence of the data units in the second code block stream by using the plurality of uplink ports by turns. Alternatively, a corresponding uplink port may be allocated to each data unit according to a rule, and then each data unit is sent by using the uplink port corresponding to the data unit. Correspondingly, in the first case, after receiving the data units of the second code block stream by using a plurality of downlink ports, a communications device on a receiver side restores the second code block stream based on the sequence of sending the data units on the sending device side. In a second case, a correspondence may be set between a downlink port and an uplink port. For example, one communications device includes 10 downlink ports, where four downlink ports may be set to correspond to one uplink port, and the other six downlink ports are set to correspond to another uplink port. In this way, after four first code block streams of the four downlink ports are multiplexed into one second code block stream, the second code block stream is sent by using the uplink port corresponding to the four downlink ports, and after six first code block streams of the six downlink ports are multiplexed into one second code block stream, the second code block stream is sent by using the uplink port corresponding to the six downlink ports. In this way, the sending efficiency of the second code block stream can be further improved.

In one embodiment of the first aspect or the second aspect, code blocks in the L code block sets are consecutively carried in the second code block stream; and the second code block stream further includes one code block set in front of a header and/or behind a tail of the L code block sets, and a header of the code block set includes at least one first control code block. The code block set including the first control code block is used to carry any one or more of the following content: indication information used to indicate a correspondence between the Q downlink ports and the S code block groups; indication information used to indicate a value of S; indication information used to indicate a value of L; indication information used to indicate the S code block groups; and indication information used to indicate a sequence of the S code block groups in a code block set in the L code block sets. Because the second code block stream can carry the foregoing indication information, the first communications device can more flexibly determine parameters in a multiplexing process, and flexibility of the solutions can be further improved. In one embodiment, the second code block stream includes a plurality of data units, and one data unit includes one or more code block sets. Information carried in a code block set including a first control code block in a data unit may be information used to indicate L code block sets carried in the current data unit, or may be information used to indicate L code block sets carried in another data unit, or may be information used to indicate code block sets carried in the current data unit and another data unit.

In one embodiment of the first aspect or the second aspect, that the first communications device obtains a to-be-sent second code block stream based on the Q first code block streams includes: The first communications device cyclically performs a code block extraction operation for L times on the Q first code block streams, to obtain the second code block stream, where for each of the L code block extraction operations, the first communications device sequentially extracts, from the Q first code block streams based on the sequence of the S code block groups, the K code blocks corresponding to each of the S code block groups.

In one embodiment of the first aspect or the second aspect, that the first communications device cyclically performs a code block extraction operation for L times on the Q first code block streams, to obtain the second code block stream includes: When no code block is extracted in a process of cyclically performing the code block extraction operation for L times, an idle idle code block is inserted into the second code block stream. In this way, a required structure form of the second code block stream can be maintained, thereby laying a basis for successful demultiplexing.

In one embodiment of the first aspect or the second aspect, the S code block groups corresponds to S buffers, and the S code block groups are in a one-to-one correspondence with the S buffers; after that a first communications device obtains Q first code block streams, and before that the first communications device obtains a to-be-sent second code block stream based on the Q first code block streams, the method further includes: The first communications device buffers code blocks in the Q first code block streams to the S buffers based on a correspondence between the S code block groups and the S buffers. That the first communications device sequentially extracts, from the Q first code block streams based on the sequence of the S code block groups, the K code blocks corresponding to each of the S code block groups includes: The first communications device sequentially extracts K code blocks from each of the S buffers based on the sequence of the S code block groups. In this way, bandwidth may be allocated to each port by using a storage capacity of a single buffer as a granularity, thereby improving bandwidth allocation flexibility.

In one embodiment of the first aspect or the second aspect, the S code block groups correspond to S buffers, and the S code block groups are in a one-to-one correspondence with the S buffers; and that the first communications device obtains a to-be-sent second code block stream based on the Q first code block streams includes: The first communications device buffers code blocks in the Q first code block streams to the S buffers based on a correspondence between the S code block groups and the S buffers; and for a code block set in the L code block sets, the first communications device sequentially extracts K code blocks from each of the S buffers based on the sequence of the S code block groups, to obtain code blocks in the code block set.

In one embodiment of the first aspect or the second aspect, that the first communications device buffers code blocks in the Q first code block streams to the S buffers based on a correspondence between the S code block groups and the S buffers includes: For a first code block stream in the Q first code block streams, the following operation is performed: When the first code block stream corresponds to one code block group, the first communications device buffers a code block in the first code block stream to a buffer corresponding to the code block group; or when the first code block stream corresponds to a plurality of code block groups, the first communications device sequentially buffers code blocks in the first code block stream to a plurality of buffers corresponding to the plurality of code block groups by turns. In this way, simplicity of the solutions can be improved, and a basis is laid for simplicity in a demultiplexing process.

In one embodiment of the first aspect or the second aspect, for a downlink port in the Q downlink ports, when a volume of buffered data in a buffer corresponding to the downlink port is greater than a first buffer volume threshold or less than a second buffer volume threshold, the second code block stream further includes one code block set in front of a header and/or behind a tail of the L code block sets, a header of the code block set includes at least one second control code block, the second control code block includes instruction information used to instruct to request a core device to reconfigure a code block group for the downlink port, and the second buffer volume threshold is less than the first buffer volume threshold. In this way, bandwidth of a port can be flexibly and timely adjusted based on a buffer volume of the port.

In one embodiment of the first aspect or the second aspect, after that a first communications device obtains Q first code block streams, and before that the first communications device obtains a to-be-sent second code block stream based on the Q first code block streams, the method further includes: For each code block in the Q first code block streams, the first communications device discards the code block when a code block type of the code block is an idle idle code block. In this way, a volume of data that needs to be transmitted can be reduced, thereby reducing network load.

In one embodiment of the first aspect or the second aspect, when R code block groups in the S code block groups meet a preset condition, the second code block stream further includes P code block sets, where P is a positive integer, and for each of the P code block sets, the code block set includes K code blocks corresponding to each of (S−R) code block groups; R is a positive integer not greater than S; the (S−R) code block groups are code block groups in the S code block groups other than the R code block groups; and that a code block group in the R code block groups meets the preset condition means that K*L consecutive code blocks corresponding to the code block group are idle code blocks. In this way, a volume of data that needs to be transmitted can be reduced, thereby reducing network load.

In one embodiment of the first aspect or the second aspect, before that a first communications device obtains Q first code block streams, the method further includes: The first communications device receives a third code block stream sent by a core device, where a header and/or a tail of the third code block stream include/includes one code block set, the code block set includes at least one third control code block, and the code block set including the third control code block includes: indication information used to indicate a correspondence between a downlink port of the first communications device and a code block group in the uplink data transmission process, and/or indication information used to indicate a correspondence between a downlink port of the first communications device and a code block group in the downlink data transmission process; and the first communications device determines the correspondence between a downlink port of the first communications device and a code block group based on the code block set including the third control code block. Because a correspondence between a port and a code block group may be delivered by the core device in a centralized manner, a ratio of a negotiation failure can be reduced, thereby improving the network running efficiency.

In one embodiment of the first aspect or the second aspect, the first communications device is connected to Q second communications devices by using the Q downlink ports, and the Q downlink ports are in a one-to-one correspondence with the Q second communications devices; and after that the first communications device receives a third code block stream sent by a core device, the method further includes: The first communications device demultiplexes code blocks in the third code block stream other than the third control code block, to obtain Q fourth code block streams, where the Q fourth code block streams are in a one-to-one correspondence with the Q downlink ports; and the first communications device distributes the Q fourth code block streams by using the Q downlink ports, where for a fourth code block stream in the Q fourth code block streams, a header and/or a tail of the fourth code block stream include/includes one code block set, the code block set includes at least one fourth control code block, and the code block set including the fourth control code block includes: indication information used to indicate a correspondence between a code block group and a downlink port, of a second communications device, corresponding to the fourth code block stream in the uplink data transmission process, and/or indication information used to indicate a correspondence between a code block group and a downlink port, of a second communications device, corresponding to the fourth code block stream in the downlink data transmission process. Because the core device may indicate a correspondence between a port of a communications device and a code block group across levels, a problem of a relatively high negotiation failure rate caused by negotiation between every two parties in the prior art can be resolved.

According to a third aspect, an embodiment of this application provides a data transmission method. In the method, a third communications device obtains a second code block stream, where the second code block stream includes L code block sets; and for each of the L code block sets, the code block set includes K code blocks corresponding to each of S code block groups, one code block in the L code block sets corresponds to one code block group, S is an integer greater than 1, and L and K are each a positive integer; and the third communications device obtains Q first code block streams based on the second code block stream, where Q is an integer greater than 1 and not greater than S, the Q first code block streams correspond to the S code block groups, and one first code block stream corresponds to one or more code block groups. In this way, code block streams can be multiplexed at a code block granularity, so that a quantity of cross connections between intermediate nodes in a network can be reduced, thereby reducing pressure on network management and operation and maintenance.

In one embodiment of the third aspect, for a code block in the L code block sets, content carried in a synchronization header area of the code block in the second code block stream is the same as content carried in a synchronization header area of the code block in the Q first code block streams; and content carried in a non-synchronization header area of the code block in the second code block stream is the same as content carried in a non-synchronization header area of the code block in the Q first code block streams. In this way, a multiplexing process can be simplified. In addition, because the non-synchronization header area in the first code block stream does not need to be independently indicated by using indication information, a data volume of the indication information can be reduced, thereby reducing network load.

According to a fourth aspect, an embodiment of this application provides a data transmission method. In the method, a third communications device obtains a second code block stream, and obtains Q first code block streams based on the second code block stream, where Q is an integer greater than 1, and for a code block, from the Q first code block streams, carried in the second code block stream, content carried in a synchronization header area of the code block in the second code block stream is the same as content carried in a synchronization header area of the code block in the Q first code block streams; and content carried in a non-synchronization header area of the code block in the second code block stream is the same as content carried in a non-synchronization header area of the code block in the Q first code block streams. In this way, code block streams can be demultiplexed at a code block granularity, so that a quantity of cross connections between intermediate nodes in a network can be reduced, thereby reducing pressure on network management and operation and maintenance. In addition, a multiplexing process can be simplified. Further, because the non-synchronization header area in the first code block stream does not need to be independently indicated by using indication information, a data volume of the indication information can be reduced, thereby reducing network load.

In one embodiment of the fourth aspect, the second code block stream includes L code block sets; and for each of the L code block sets, the code block set includes K code blocks corresponding to each of S code block groups, one code block in the L code block sets corresponds to one code block group, S is an integer greater than 1, and L and K are each a positive integer; and Q is an integer greater than 1 and not greater than S, the Q first code block streams corresponds to the S code block groups, and one first code block stream corresponds to one or more code block groups.

In one embodiment of the third aspect or the fourth aspect, when the third communications device is not a core device, a value of S is a total quantity of code block groups corresponding to the Q downlink ports in a downlink data transmission process, and each of the S code block groups is a code block group corresponding to the Q downlink ports in the downlink data transmission process. When the third communications device is a core device, a value of S is a total quantity of code block groups corresponding to the Q downlink ports in an uplink data transmission process, and each of the S code block groups is a code block group corresponding to the Q downlink ports in the uplink data transmission process. In other words, a quantity of code block groups allocated to Q downlink ports of a communications device in the uplink data transmission process may be the same as or different from a quantity of code block groups allocated to the Q downlink ports of the communications device in the uplink data transmission process. In addition, for a downlink port in the Q downlink ports of the communications device, a code block group allocated to the downlink port in the uplink data transmission process may be the same as or different from a code block group allocated to the downlink port in the uplink data transmission process, and a code block group allocated to a port may be marked by a code block group identifier or other identifier information allocated to the port, where the code block group identifier or the other identifier information can uniquely identify the code block group. In this way, flexibility of the solutions can be improved.

In one embodiment of the third aspect or the fourth aspect, one downlink port may correspond to one or more code block groups, but one code block group corresponds to only one downlink port. In this way, bandwidth may be allocated to the downlink port by using the code block group as a granularity.

In the third aspect or the fourth aspect, the downlink port may be a port that is on the communications device and that has a direct or indirect data transmission relationship with a terminal device side. Correspondingly, the communications device may further include an uplink port, and the uplink port is a port that is on the communications device and that has a direct or indirect data transmission relationship with a core device side. In subsequent embodiments, descriptions may be made by using examples with reference to the accompanying drawings.

In one embodiment of the third aspect or the fourth aspect, the third communications device obtains the second code block stream in a plurality of manners. When receiving the second code block stream by using an uplink port, the third communications device may receive the second code block stream by using one or more uplink ports. When a communications device on a sending side sends the second code block stream by using a plurality of downlink ports, the communications device on the sending side may use a data unit as a granularity of the second code block stream, and sends data units in a sequence of the data units in the second code block stream by using the plurality of uplink ports by turns. Alternatively, a corresponding uplink port may be allocated to each data unit according to a rule, and then each data unit is sent by using the uplink port corresponding to the data unit. Correspondingly, after receiving the data units of the second code block stream by using the plurality of downlink ports, the third communications device (a communications device on a receiver side) restores the second code block stream based on the sequence of sending the data units on the sending device side.

In one embodiment of the third aspect or the fourth aspect, code blocks in the L code block sets are consecutively carried in the second code block stream; and the second code block stream further includes one code block set in front of a header and/or behind a tail of the L code block sets, and a header of the code block set includes at least one first control code block. The code block set including the first control code block is used to carry any one or more of the following content: indication information used to indicate a correspondence between the Q downlink ports and the S code block groups, where the Q downlink ports are in a one-to-one correspondence with the Q first code block streams; indication information used to indicate a value of S; indication information used to indicate a value of L; indication information used to indicate the S code block groups; and indication information used to indicate a sequence of the S code block groups in a code block set in the L code block sets. Because the second code block stream can carry the foregoing indication information, the communications device can more flexibly determine parameters in a multiplexing process, and flexibility of the solutions can be further improved.

In one embodiment of the third aspect or the fourth aspect, that the third communications device obtains Q first code block streams based on the second code block stream includes: For each of the L code block sets, the third communications device sequentially extracts, from the code block set based on the sequence of the S code block groups, the K code blocks corresponding to each of the S code block groups, to obtain the Q first code block streams.

In one embodiment of the third aspect or the fourth aspect, the S code block groups correspond to S buffers, and the S code block groups are in a one-to-one correspondence with the S buffers; and after that the third communications device sequentially extracts, from the code block set based on the sequence of the S code block groups, the K code blocks corresponding to each of the S code block groups, and before that the third communications device obtains the Q first code block streams, the method further includes: The third communications device buffers, based on a correspondence between the S code block groups and the S buffers, the K code blocks corresponding to each of the S code block groups to a buffer corresponding to the code block group. In this way, bandwidth may be allocated to each port by using a storage capacity of a single buffer as a granularity, thereby improving bandwidth allocation flexibility.

In one embodiment of the third aspect or the fourth aspect, the second code block stream further includes one code block set in front of a header and/or behind a tail of the L code block sets, the code block set includes at least one first control code block, and the code block set including the first control code block includes: indication information used to indicate a correspondence between the Q downlink ports of the third communications device and the S code block groups in the uplink data transmission process, and/or indication information used to indicate a correspondence between the Q downlink ports of the third communications device and the S code block groups in the downlink data transmission process. That the third communications device obtains Q first code block streams based on the second code block stream includes: The third communications device obtains the correspondence between the Q downlink ports and the S code block groups based on the code block set including the first control code block; and the third communications device demultiplexes the L code block sets into the Q first code block streams based on the correspondence between the Q downlink ports and the S code block groups. Because a correspondence between a port and a code block group may be delivered by using the second code block stream, a ratio of a negotiation failure can be reduced, thereby improving the network running efficiency.

In one embodiment of the third aspect or the fourth aspect, the third communications device is connected to Q fourth communications devices by using the Q downlink ports, and the Q downlink ports are in a one-to-one correspondence with the Q fourth communications devices; and after the third communications device obtains Q first code block streams based on the second code block stream, the method further includes: The third communications device distributes the Q first code block streams by using the Q downlink ports, where a header and/or a tail of a first code block stream include/includes one code block set, the code block set includes at least one fifth control code block, and the code block set including the fifth control code block includes: indication information used to indicate a correspondence between a code block group and a downlink port, of a fourth communications device, corresponding to the first code block stream in the uplink data transmission process, and/or indication information used to indicate a correspondence between a code block group and a downlink port, of a fourth communications device, corresponding to the first code block stream in the downlink data transmission process. Because in the embodiments of this application, a correspondence between a port of a communications device and a code block group may be indicated across levels, a problem of a relatively high negotiation failure rate caused by negotiation between every two parties in the prior art can be resolved.

According to a fifth aspect, an embodiment of this application provides a communications device. The communications device includes a memory, a communications interface, and a processor, where the memory is configured to store an instruction; and the processor is configured to execute the instruction stored in the memory, and control the communications interface to receive and send signals. When the processor executes the instruction stored in the memory, the communications device is configured to perform any method in any one of the first aspect, the second aspect, the possible embodiments of the first aspect, or the possible embodiments of the second aspect.

According to a sixth aspect, an embodiment of this application provides a communications device. The communications device includes a memory, a communications interface, and a processor, where the memory is configured to store an instruction; and the processor is configured to execute the instruction stored in the memory, and control the communications interface to receive and send signals. When the processor executes the instruction stored in the memory, the communications device is configured to perform any method in any one of the third aspect, the fourth aspect, the possible embodiments of the third aspect, or the possible embodiments of the fourth aspect.

According to a seventh aspect, an embodiment of this application provides a communications device. The communications device is configured to perform any method in any one of the first aspect, the second aspect, the possible embodiments of the first aspect, or the possible embodiments of the second aspect, and includes corresponding function modules, configured to implement operations in the foregoing method. A function may be implemented by hardware, or may be implemented by hardware executing corresponding software. The hardware or software includes one or more modules corresponding to the foregoing function.

In a possible design, a structure of the communications device includes a multiplexing/demultiplexing unit and a communications interface. The multiplexing/demultiplexing unit and the communications interface may perform corresponding functions in the foregoing method example. For details, refer to detailed descriptions in the method example. Details are not described herein again.

According to an eighth aspect, an embodiment of this application provides a communications device. The communications device is configured to perform any method in any one of the third aspect, the fourth aspect, the possible embodiments of the third aspect, or the possible embodiments of the fourth aspect, and includes corresponding function modules, configured to implement operations in the foregoing method. A function may be implemented by hardware, or may be implemented by hardware executing corresponding software. The hardware or software includes one or more modules corresponding to the foregoing function.

In a possible design, a structure of the communications device includes a multiplexing/demultiplexing unit and a communications interface. The multiplexing/demultiplexing unit and the communications interface may perform corresponding functions in the foregoing method example. For details, refer to detailed descriptions in the method example. Details are not described herein again.

According to a ninth aspect, an embodiment of this application provides a computer storage medium. The computer storage medium stores an instruction, and when the instruction is run on a computer, the computer is enabled to perform any method in any one of the first aspect, the second aspect, the possible embodiments of the first aspect, or the possible embodiments of the second aspect.

According to a tenth aspect, an embodiment of this application provides a computer storage medium. The computer storage medium stores an instruction, and when the instruction is run on a computer, the computer is enabled to perform any method in any one of the third aspect, the fourth aspect, the possible embodiments of the third aspect, or the possible embodiments of the fourth aspect.

According to an eleventh aspect, an embodiment of this application provides a computer program product including an instruction, and when the computer program product is run on a computer, the computer is enabled to perform any method in any one of the first aspect, the second aspect, the possible embodiments of the first aspect, or the possible embodiments of the second aspect.

According to a twelfth aspect, an embodiment of this application provides a computer program product including an instruction, and when the computer program product is run on a computer, the computer is enabled to perform any method in any one of the third aspect, the fourth aspect, the possible embodiments of the third aspect, or the possible embodiments of the fourth aspect.

DESCRIPTION OF EMBODIMENTS

It should be understood that the technical solutions in the embodiments of this application may be applied to various communications systems, for example, a mobile bearer fronthaul or backhaul field, a metropolitan multi-service bearer, a data center interconnection, industrial communication, and other Ethernet technology-based communications systems, and a communications system between different components or modules in an industrial device or a communications device.

Figure 1:
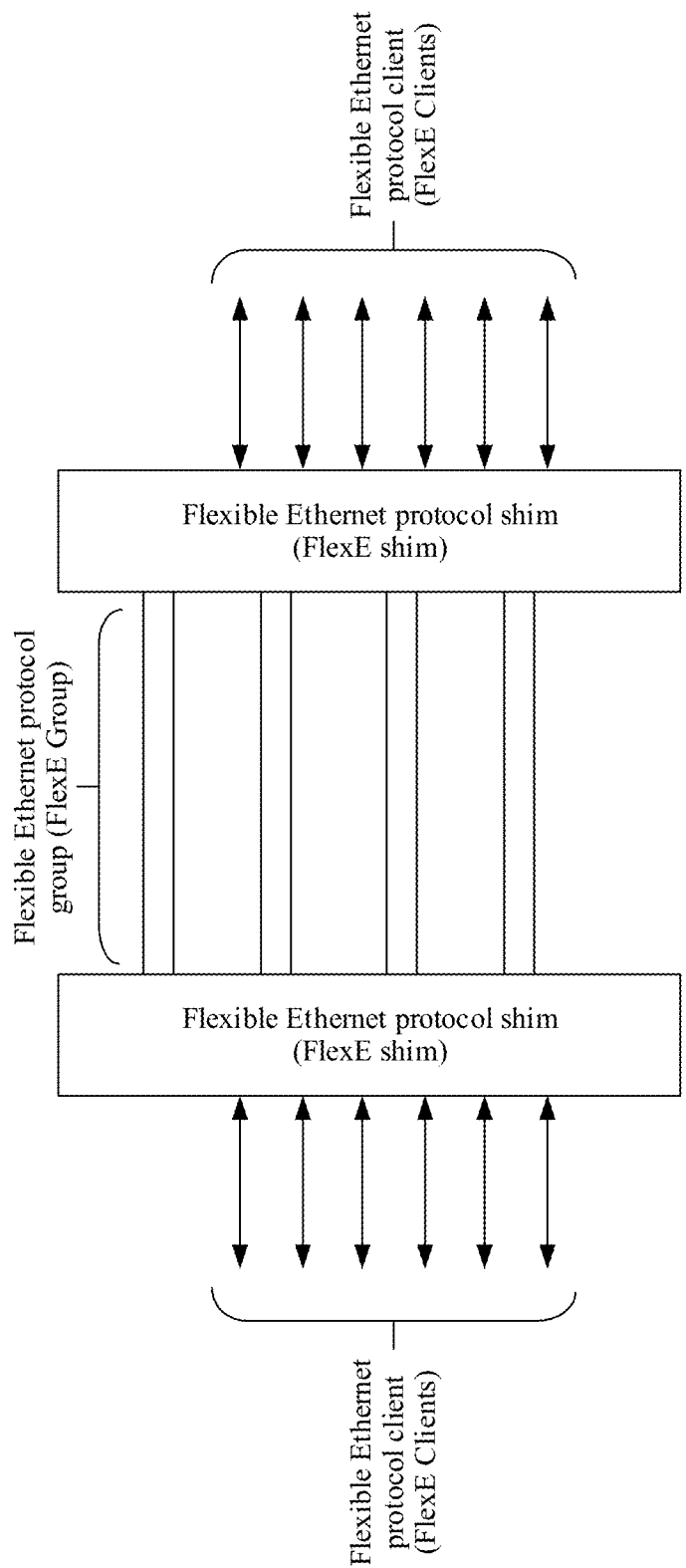
FIG. 1 is a schematic diagram of a communications system that is based on the flexible Ethernet protocol.
Figure 2:
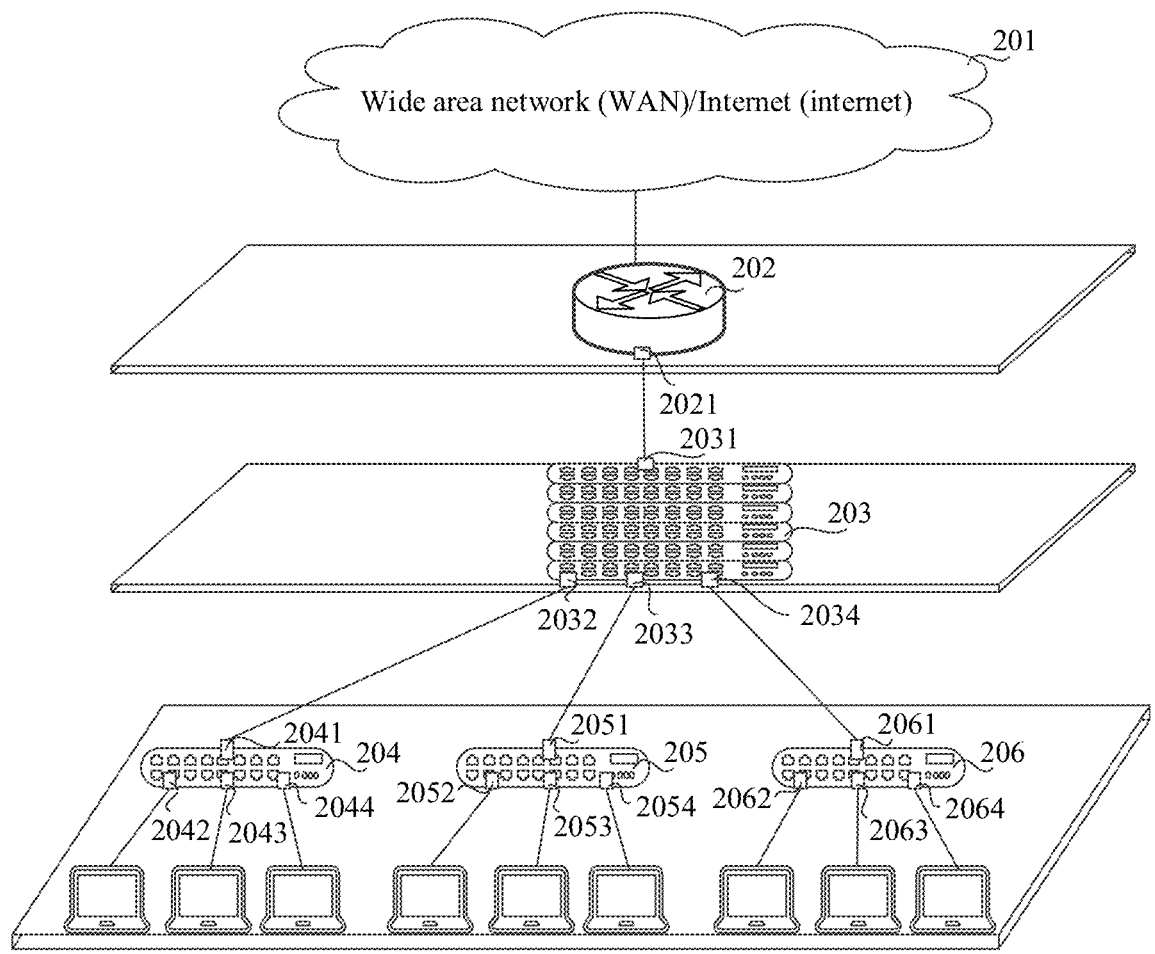
FIG. 2 is a schematic diagram of a communications system architecture to which an embodiment of this application is applicable.

The communications system to which the embodiments of this application are applicable may include a plurality of communications devices, and the communications devices in the communications system may be a core device, an aggregation device, an access device, and the like. The core device may be a core layer switch, a central device, a campus core switch, a central office switch, or the like; the aggregation device may be a device such as an aggregation layer switch; and the access device may be a device such as an access layer switch, a corridor switch, or a desktop switch. The access device and the aggregation device may be a same device, but are placed at different positions. The aggregation device is responsible for aggregation at a middle layer, and the access device is responsible for access of a client at an access layer. FIG. 2 is an example of a schematic diagram of a communications system architecture to which an embodiment of this application is applicable. As shown in FIG. 2, a wide area network (WAN) and/or an internet 201 may be connected to one or more core devices 202, and each core device 202 may be connected to one or more aggregation devices 203. Each aggregation device 203 may be connected to one or more access devices, for example, an access device 204, an access device 205, and an access device 206 that are connected to the aggregation device 203 shown in FIG. 2. Each access device may be connected to one or more terminal devices.

As shown in FIG. 2, one downlink port of the core device 202 is connected to one uplink port of an aggregation device. As shown in FIG. 2, a downlink port 2021 of the core device 202 is connected to an uplink port 2031 of the aggregation device 203. The aggregation device 203 has one or more downlink ports. One downlink port of the aggregation device 203 is connected to an uplink port of one access device. As shown in FIG. 2, a downlink port 2032 of the aggregation device 203 is connected to an uplink port 2041 of the access device 204, and a downlink port 2033 of the aggregation device 203 is connected to an uplink port 2051 of the access device 205, and a downlink port 2034 of the aggregation device 203 is connected to an uplink port 2061 of the access device 206. One downlink port of the access device may be connected to one terminal device. As shown in FIG. 2, a downlink port 2042, a downlink port 2043, and a downlink port 2044 of the access device 204 are respectively connected to three terminal devices, a downlink port 2052, a downlink port 2053, and a downlink port 2054 of the access device 205 are respectively connected to three terminal devices, and a downlink port 2062, a downlink port 2063, and a downlink port 2064 of the access device 206 are respectively connected to three terminal devices. In the embodiments of this application, one uplink port is only used as an example in FIG. 2 and FIG. 3. In actual application, a person skilled in the art may learn that one communications device may include one or more uplink ports.

In the embodiments of this application, the downlink port may be a port that is on the communications device and that has a direct or indirect data transmission relationship with a terminal device side, and the uplink port is a port that is on the communications device and that has a direct or indirect data transmission relationship with a core device side.

Figure 3:
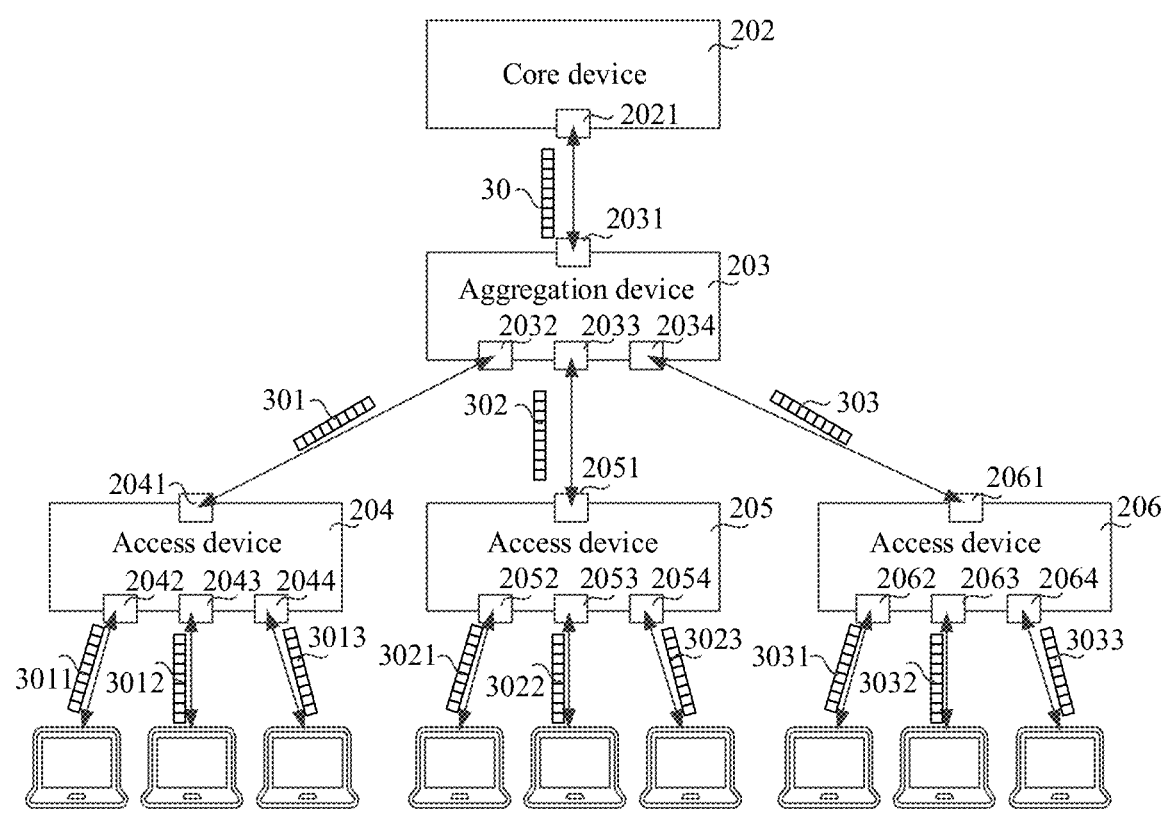
FIG. 3 shows a data transmission solution in the communications system architecture shown in FIG. 2 according to an embodiment of this application.

An uplink data transmission process in the embodiments of this application is a process of transmitting a data stream from the terminal device side to the core device side, and a downlink data transmission process is a process of transmitting a data stream from the core device side to the terminal device side. Based on the schematic diagram of the communications system architecture shown in FIG. 2, FIG. 3 shows an example of a data transmission solution in the communications system architecture shown in FIG. 2 according to an embodiment of this application. As shown in FIG. 3, in an uplink data transmission process, each terminal device sends a code block stream to an access device by using an uplink port, and each access device receives, by using a downlink port, the code block stream sent by each terminal device, multiplexes a plurality of received code block streams into one code block stream, and sends the multiplexed code block stream to an aggregation device by using an uplink port of the access device. Correspondingly, the aggregation device receives, by using a plurality of downlink ports, code block streams sent by access devices, multiplexes the code block streams into one code block stream, and sends the multiplexed code block stream to a core device by using an uplink port of the aggregation device. After receiving, by using a downlink port connected to the aggregation device, the code block stream sent by the aggregation device, the core device demultiplexes the code block stream, and finally obtains the code block stream sent by each terminal device, and processes the code block stream sent by each terminal device.

Uplink data transmission is described with reference to FIG. 3. As shown in FIG. 3, an access device 204 receives a code block stream 3011 by using a downlink port 2042, receives a code block stream 3012 by using a downlink port 2043, and receives a code block stream 3013 by using a downlink port 2044, multiplexes the code block stream 3011, the code block stream 3012, and the code block stream 3013 into a code block stream 301, and sends the code block stream 301 to an aggregation device 203 by using an uplink port 2041. An access device 205 receives a code block stream 3021 by using a downlink port 2052, receives a code block stream 3022 by using a downlink port 2053, and receives a code block stream 3023 by using a downlink port 2054, multiplexes the code block stream 3021, the code block stream 3022, and the code block stream 3023 into a code block stream 302, and sends the code block stream 302 to the aggregation device 203 by using an uplink port 2051. An access device 206 receives a code block stream 3031 by using a downlink port 2062, receives a code block stream 3032 by using a downlink port 2063, and receives a code block stream 3033 by using a downlink port 2064, multiplexes the code block stream 3031, the code block stream 3032, and the code block stream 3033 into a code block stream 303, and sends the code block stream 303 to the aggregation device 203 by using an uplink port 2061. The aggregation device 203 multiplexes the code block stream 301 received by using a downlink port 2032, the code block stream 302 received by using a downlink port 2033, and the code block stream 303 received by using a downlink port 2034 into one code block stream 30, and sends the code block stream 30 to a core device 202 by using an uplink port 2031 of the aggregation device 203. The core device 202 demultiplexes the code block stream 30 received by using a downlink port 2021, to finally obtain the code block stream 3011, the code block stream 3012, and the like that correspond to the terminal devices, and performs subsequent processing on the code block streams.

In a downlink data transmission process, as shown in FIG. 3, a core device multiplexes code block streams corresponding to terminal devices, to obtain a multiplexed code block stream. In this process, the core device may perform one-level or multi-level multiplexing on the code block streams, and sends the multiplexed code block stream to an aggregation device by using a downlink port of the core device. The aggregation device demultiplexes the received downlink code block stream to obtain a plurality code block streams corresponding to downlink ports, and sends, by using the downlink ports of the aggregation device, the code block streams to access devices connected to the aggregation device. After receiving the code block stream, the access device demultiplexes the code block stream to obtain a plurality of code block streams corresponding to the downlink ports of the access device, and sends the code block streams by using the downlink ports of the access device.

Downlink data transmission is described with reference to FIG. 3. As shown in FIG. 3, a core device 202 generates a code block stream 30, and sends the code block stream 30 to an aggregation device 203 by using a downlink port 2021. A process in which the core device 202 generates the code block stream 30 is as follows: The core device 202 performs multi-level multiplexing on code block streams that are to be sent to terminal devices, to finally obtain the code block stream 30. The multiplexing process is similar to the multiplexing process on the code block streams in the foregoing uplink transmission process. The core device first multiplexes a code block stream 3011, a code block stream 3012, and a code block stream 3013 into a code block stream 301, multiplexes a code block stream 3021, a code block stream 3022, and a code block stream 3023 into a code block stream 302, and multiplexes a code block stream 3031, a code block stream 3032, and a code block stream 3033 into a code block stream 303, and then multiplexes the code block stream 301, the code block stream 302, and code block stream 303 into the code block stream 30. After receiving the code block stream 30 by using an uplink port 2031, the aggregation device 203 demultiplexes the code block stream 30 to obtain the code block stream 301, the code block stream 302, and the code block stream 303, and sends the code block stream 301, the code block stream 302, and the code block stream 303 to access devices by using downlink ports. After receiving the code block stream 301 by using an uplink port 2041 of an access device 204, the access device 204 demultiplexes the code block stream 301 to obtain the code block stream 3011, the code block stream 3012, and the code block stream 3013, and the access device 204 sends the demultiplexed code block streams to terminal devices by using downlink ports. Downlink data transmission of an access device 205 and an access device 206 is similar to that of the access device 204. Details are not described again.

It can be learned from the foregoing descriptions of the data transmission process with reference to FIG. 3 that, in the embodiments of this application, in the uplink transmission process, each level of device involves the multiplexing process on the code block streams, and the core device involves the demultiplexing process on the code block stream. In the downlink transmission process, the core device involves the multiplexing process on the code block streams, each level of device involves the demultiplexing process on the code block stream. The multiplexing process and the demultiplexing process involved in this application are described in detail below in the embodiments of this application.

The code block stream (for example, a first code block stream and a second code block stream) defined in the embodiments of this application may be a data stream using a code block as a unit. In this case, in the embodiments of this application, a preset quantity of bits in a bit stream (the bit stream may be encoded or not encoded) may be referred to as a code block (the code block may also be referred to as a bit group or a bit block). A code block in the embodiments of this application may include a synchronization header area, or may not include a synchronization header area. A coding form of a code block in the embodiments of this application may also be written as M1/N1 bit coding. M1 and N1 are each a positive integer, and N1 is not less than M1. In one embodiment, M1 may be equal to N1. For example, in the embodiments of this application, one bit may be referred to as a code block, and for another example, two bits may be referred to as a code block. In one embodiment, the code block defined in the embodiments of this application may be a code block obtained after a bit stream is encoded by using an encoding type. In the embodiments of this application, some coding manners are defined, such as M1/N1 bit coding.

In one embodiment, M1 may be equal to N1. In this way, if a code block is divided into a synchronization header area and a non-synchronization header area, it may be understood as that a bit carried in the synchronization header area is 0. Alternatively, it may be understood that a preset quantity of bits are referred to as a code block.

In one embodiment, N1 may be greater than M1. In one case, N1 is greater than M1, but there is no explicit synchronization header. For example, the M1/N1 bit coding is 8B/10B bit coding. In another case, N1 is greater than M1, and the code block may include a synchronization header area (the synchronization header area includes (N1−M1) bits) and a non-synchronization header area (the non-synchronization header area includes M1 bits). The M1/N1 bit coding may be 64B/66B coding (or may be written as 64/66 bit coding), 256B/257B coding, 512B/514B coding, 64B/67B coding, or the like defined in 802.3.

Structure forms of some code blocks are specified in the prior art, such as a control code block, a data code block, and an idle code block. The idle code block also belongs to the control code block. Code blocks (for example, a code block in the first code block stream and a code block in the second code block stream) in the embodiments of this application may be the code blocks specified in the prior art.

The term "and/or" in this specification describes only an association relationship for describing associated objects and represents that three relationships may exist. For example, A and/or B may represent the following three cases: Only A exists, both A and B exist, and only B exists. In addition, the character "/" in this specification generally represents an "or" relationship between associated objects. In the embodiments of this application, "one-to-one correspondence" is used to describe an association relationship between objects. For example, that C As are in a one-to-one correspondence with C Bs, indicates that each of the C As corresponds to one of the C Bs and each of the C Bs corresponds to one of the C As, any two As in the C As correspond to two different Bs in the C Bs, and any two Bs in the C Bs correspond to two different As in the C As.

An identifier is used to identify an object, and the object may be a communications device, a port, a code block group, or the like. The identifier may include at least one of a name, a number, or an ID (Identification), provided that the identified object can be distinguished from another object.

"First", "second", . . . , and "nine" in the embodiments of this application are merely used for differentiation, and does not have another limitation meaning, for example, a "first control code block", a "second control code block", . . . , and a "ninth control code block", for another example, a "first code block stream", a "second code block stream", a "third code block stream", and the like, and for another example, a "first communications device", a "second communications device", a "third communications device", and the like.

Figure 4:
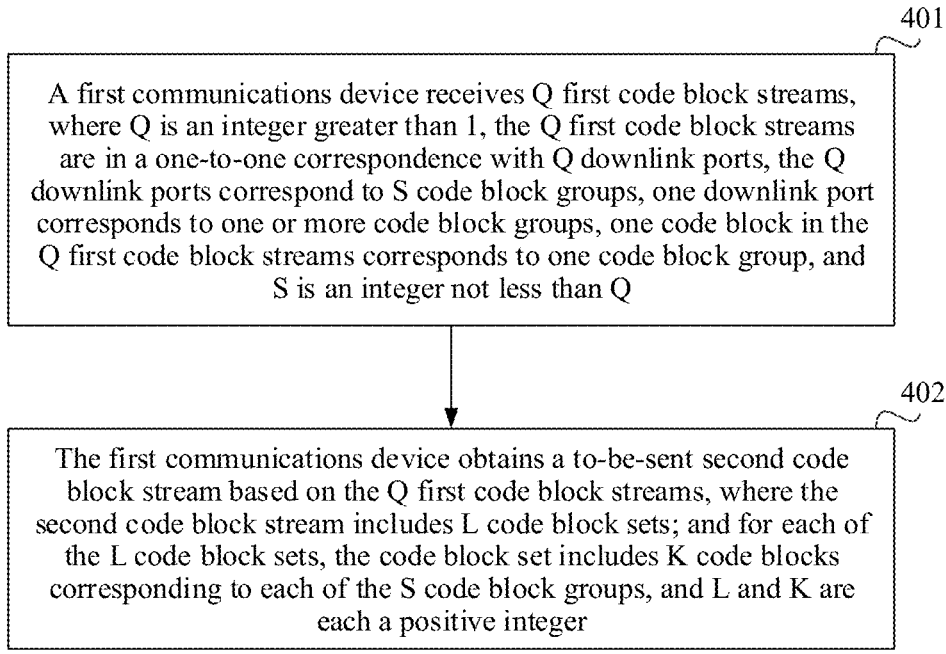
FIG. 4 is a schematic flowchart of a data transmission method according to an embodiment of this application.

Based on the foregoing content, FIG. 4 is an example of a schematic flowchart of a data transmission method according to an embodiment of this application. The schematic flowchart of the method shown in FIG. 4 is applicable to a communications device on a multiplexing side. As shown in FIG. 4, the method includes the following operations.

Operation 401: A first communications device obtains Q first code block streams, where Q is an integer greater than 1, the Q first code block streams are in a one-to-one correspondence with Q downlink ports, the Q downlink ports correspond to S code block groups, one downlink port corresponds to one or more code block groups, one code block in the Q first code block streams corresponds to one code block group, and S is an integer not less than Q.

In the foregoing operation 401, in one embodiment, one downlink port may correspond to one or more code block groups, but one code block group corresponds to only one downlink port. In this way, bandwidth may be allocated to the downlink port by using the code block group as a granularity, and because one code block group corresponds to only one downlink port, complexity can also be reduced when multiplexing or demultiplexing is performed.

Operation 402: The first communications device obtains a to-be-sent second code block stream based on the Q first code block streams, where the second code block stream includes L code block sets; and for each of the L code block sets, the code block set includes K code blocks corresponding to each of the S code block groups, and L and K are each a positive integer.

It can be learned from the solutions provided in the foregoing operation 401 and operation 402 that, in this embodiment of this application, because the code block streams are multiplexed, a quantity of cross connections between intermediate nodes (the intermediate nodes are, for example, the access device and the aggregation devices in FIG. 2 and FIG. 3) can be reduced, thereby reducing workload of network management and operation and maintenance.

Further, when the first communications device is not a core device, for example, is an aggregation device or an access device, because in this embodiment of this application, after receiving the Q first code block streams, the first communications device multiplexes and sends the Q first code block streams, an operation such as MAC header parsing does not need to be performed on the received code block streams as in the prior art, and workload of forwarding a data stream by the first communications device is reduced. In addition, a structure form of the first communications device may also be simplified. For example, a component (for example, a central processing unit (CPU) and a link switching (LSW) chip) configured to parse a MAC header does not need to be disposed for the first communications device, or a route forwarding entry does not need to be configured, thereby reducing costs of the first communications device.

In one embodiment, coding forms of the first code block stream and the second code block stream in this embodiment of this application are both M1/N1 bit coding, and any code block in the first code block stream and the second code block stream includes a non-synchronization header area of (N1−M1) bits and a synchronization header area of M1 bits.

In one embodiment, in the foregoing operation 401 and operation 402, in a process in which the first communications device multiplexes the Q first code block streams into the second code block stream, information carried in synchronization header areas in the first code block stream may be changed. In this case, indication information may be added to the second code block stream, to indicate non-synchronization header areas of code blocks in the multiplexed first code block streams.

In one embodiment, in a process of multiplexing the first code block streams into the second code block stream, neither non-synchronization header areas nor synchronization header areas in the first code block streams are changed. In this way, complexity of demultiplexing can be reduced, and because the non-synchronization header areas and the synchronization header areas are not changed, it is unnecessary to indicate the non-synchronization header areas of the code blocks in the multiplexed first code block streams, so that a data volume of the indication information can be reduced, and network load is further reduced. In this case, for a code block in the L code block sets, content carried in a synchronization header area of the code block in the second code block stream is the same as content carried in a synchronization header area of the code block in the Q first code block streams; and content carried in a non-synchronization header area of the code block in the second code block stream is the same as content carried in a non-synchronization header area of the code block in the Q first code block streams.

Figure 5:
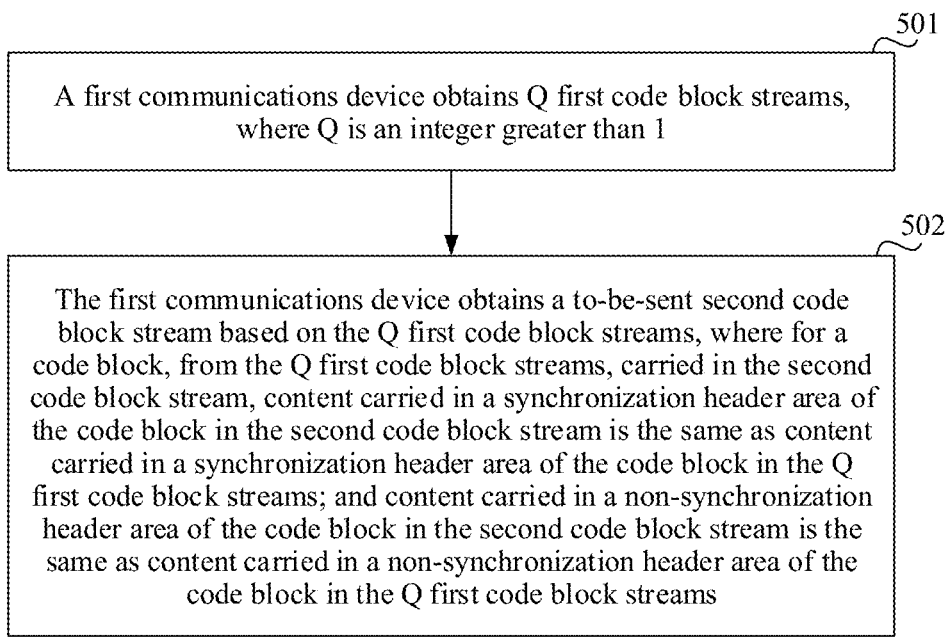
FIG. 5 is a schematic flowchart of another data transmission method according to an embodiment of this application.

Based on the content shown in FIG. 2 and FIG. 3, FIG. 5 is an example of a schematic flowchart of a data transmission method according to an embodiment of this application. The schematic flowchart of the method shown in FIG. 5 is applicable to a communications device on a multiplexing side. As shown in FIG. 5, the method includes the following operations.

Operation 501: A first communications device obtains Q first code block streams, where Q is an integer greater than 1.

In operation 501, for a manner in which the first communications device obtains the Q first code block streams and a role of the first communications device in actual application, refer to related descriptions of the foregoing operation 401. Details are not described herein again.

Operation 502: The first communications device obtains a to-be-sent second code block stream based on the Q first code block streams, where for a code block, from the Q first code block streams, carried in the second code block stream, content carried in a synchronization header area of the code block in the second code block stream is the same as content carried in a synchronization header area of the code block in the Q first code block streams; and content carried in a non-synchronization header area of the code block in the second code block stream is the same as content carried in a non-synchronization header area of the code block in the Q first code block streams.

It can be learned from the solution provided in the foregoing operation 501 and operation 502 that, because the code block streams are multiplexed, a quantity of cross connections between intermediate nodes (where the intermediate nodes are, for example, the access device and the aggregation devices in FIG. 2 and FIG. 3) can be reduced, thereby reducing workload of network management and operation and maintenance. In addition, in a process of multiplexing the Q first code block streams into the second code block stream, neither non-synchronization header areas nor synchronization header areas in the first code block streams are changed. In this way, complexity of demultiplexing can be reduced, and because the non-synchronization header areas and the synchronization header areas are not changed, it is unnecessary to indicate the non-synchronization header areas of the code blocks in the multiplexed first code block streams, so that a data volume of the indication information can be reduced, and network load is further reduced.

Based on the solutions shown in FIG. 4 and FIG. 5, the first communications device performing the solutions shown in FIG. 4 and FIG. 5 has a plurality of roles. In a first case, when the first communications device is not a core device, for example, may be the access device, or the aggregation device that performs the multiplexing process in the uplink data transmission process in FIG. 2 and FIG. 3, the Q downlink ports in the foregoing operation 401 may be downlink ports of the first communications device, and in the foregoing operation 401, the first communications device may receive the Q first code block streams by using the Q downlink ports of the first communications device.

When the first communications device is not a core device, in the foregoing operation 402, after obtaining the second code block stream, the first communications device may send the second code block stream in a plurality of manners, and may send the second code block stream by using one or more uplink ports. The following provides descriptions of two cases. In a first case, the second code block stream is sent by using a plurality of uplink ports. In this case, a data unit may be used as a granularity of the second code block stream, and data units are sent in a sequence of the data units in the second code block stream by using the plurality of uplink ports by turns. Alternatively, a corresponding uplink port may be allocated to each data unit according to a rule, and then each data unit is sent by using the uplink port corresponding to the data unit. Correspondingly, in the first case, after receiving the data units of the second code block stream by using a plurality of downlink ports, a communications device on a receiver side restores the second code block stream based on the sequence of sending the data units on the sending device side. In a second case, a correspondence may be set between a downlink port and an uplink port. For example, one communications device includes 10 downlink ports, where four downlink ports may be set to correspond to one uplink port, and the other six downlink ports are set to correspond to another uplink port. In this way, after four first code block streams of the four downlink ports are multiplexed into one second code block stream, the second code block stream is sent by using the uplink port corresponding to the four downlink ports, and after six first code block streams of the six downlink ports are multiplexed into one second code block stream, the second code block stream is sent by using the uplink port corresponding to the six downlink ports. In this way, the sending efficiency of the second code block stream can be further improved.

In a second case, the first communications device performing the solutions shown in FIG. 4 or FIG. 5 may alternatively be the core device performing the multiplexing process in the downlink data transmission process in FIG. 2 and FIG. 3, and the core device may perform one-level or multi-level multiplexing on the code block streams. In this case, the Q downlink ports are Q downlink ports of a communications device that demultiplexes the Q first code block streams in the downlink transmission process. An example is described with reference to FIG. 3. For example, when the Q first code block streams are code block streams that need to be received by Q terminal devices (where the Q first code block streams are the code block stream 3011, the code block stream 3012, and the code block stream 3013), the core device may receive, by using the Internet, the Q first code block streams sent by another core device. In this case, the Q downlink ports are Q downlink ports of a communications device connected to the Q terminal devices (in one embodiment, the Q downlink ports are the downlink port 2042, the downlink port 2043, and the downlink port 2044 of the access device 204). For another example, when the Q first code block streams are code block streams that need to be received by Q access devices (where the Q first code block streams are the code block stream 301, the code block stream 302, and the code block stream 303), the Q first code block streams may be obtained after the core device performs one-level or multi-level multiplexing on received code block streams corresponding to terminal devices. In addition, in this case, the Q downlink ports are Q downlink ports of a communications device connected to the Q access devices (in one embodiment, the Q downlink ports are the downlink port 2032, the downlink port 2033, and the downlink port 2034 of the aggregation device 203).

In the solutions shown in FIG. 4 and FIG. 5, an embodiment is provided. When the first communications device is not a core device, a value of S in FIG. 4 and FIG. 5 is a total quantity of code block groups corresponding to the Q downlink ports in the uplink data transmission process, and each of the S code block groups is a code block group corresponding to the Q downlink ports in the uplink data transmission process.

However, when the first communications device is a core device, a value of S is a total quantity of code block groups corresponding to the Q downlink ports in the downlink data transmission process, and each of the S code block groups is a code block group corresponding to the Q downlink ports in the downlink data transmission process.

In other words, a quantity of code block groups allocated to Q downlink ports of a communications device in the uplink data transmission process may be the same as or different from a quantity of code block groups allocated to the Q downlink ports of the communications device in the uplink data transmission process. In addition, for a downlink port in the Q downlink ports of the communications device, a code block group allocated to the downlink port in the uplink data transmission process may be the same as or different from a code block group allocated to the downlink port in the uplink data transmission process, and a code block group allocated to a port may be marked by a code block group identifier or other identifier information allocated to the port, where the code block group identifier or the other identifier information can uniquely identify the code block group. For example, in the uplink data transmission process, three code block groups are allocated to three downlink ports of the first communications device, where a code block group 1 is allocated to a downlink port 1, a code block group 2 is allocated to a downlink port 2, and a code block group 3 is allocated to a downlink port 3. In the uplink data transmission process, three code block groups are allocated to the three downlink ports of the first communications device, where a code block group 1 is allocated to the downlink port 1, code block groups 4 and 5 are allocated to the downlink port 4 2, and a code block group 2 is allocated to the downlink port 3. It can be learned that in this embodiment of this application, a code block group allocated to each downlink port may be classified into a code block group in the uplink data transmission process and a code block group in the downlink data transmission process. In this way, flexibility of the solutions can be improved. However, to improve simplicity of the solutions, a code block group allocated to a downlink port in the uplink data transmission process may alternatively be, by default, the same as a code block group allocated to the downlink port in the downlink data transmission process. In this embodiment of this application, a code block group corresponding to a downlink port may also be described as a code block group allocated to the downlink port.

Figure 6A:
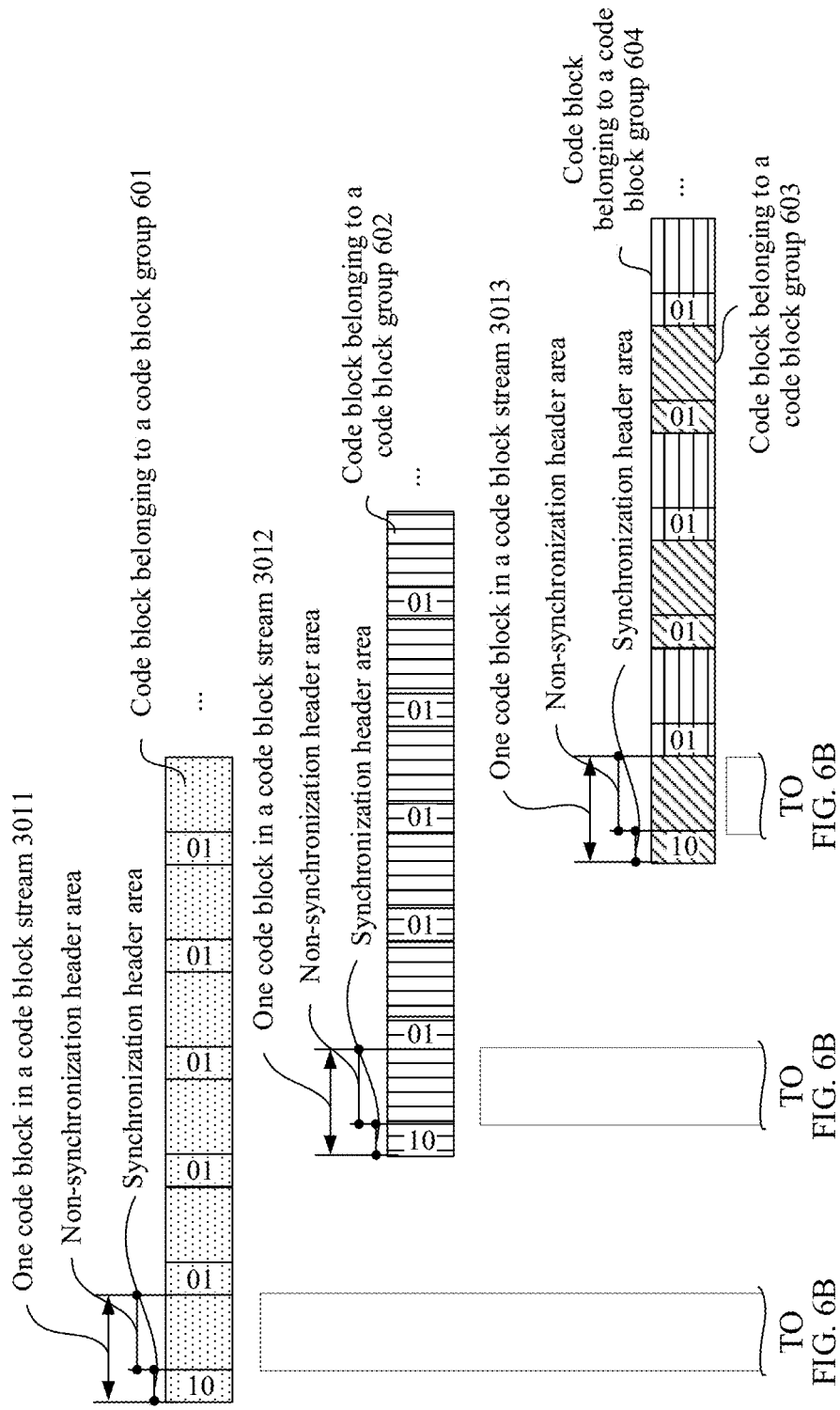
FIG. 6A and FIG. 6B are a schematic structural diagram of a second code block stream according to an embodiment of this application.
Figure 6B:
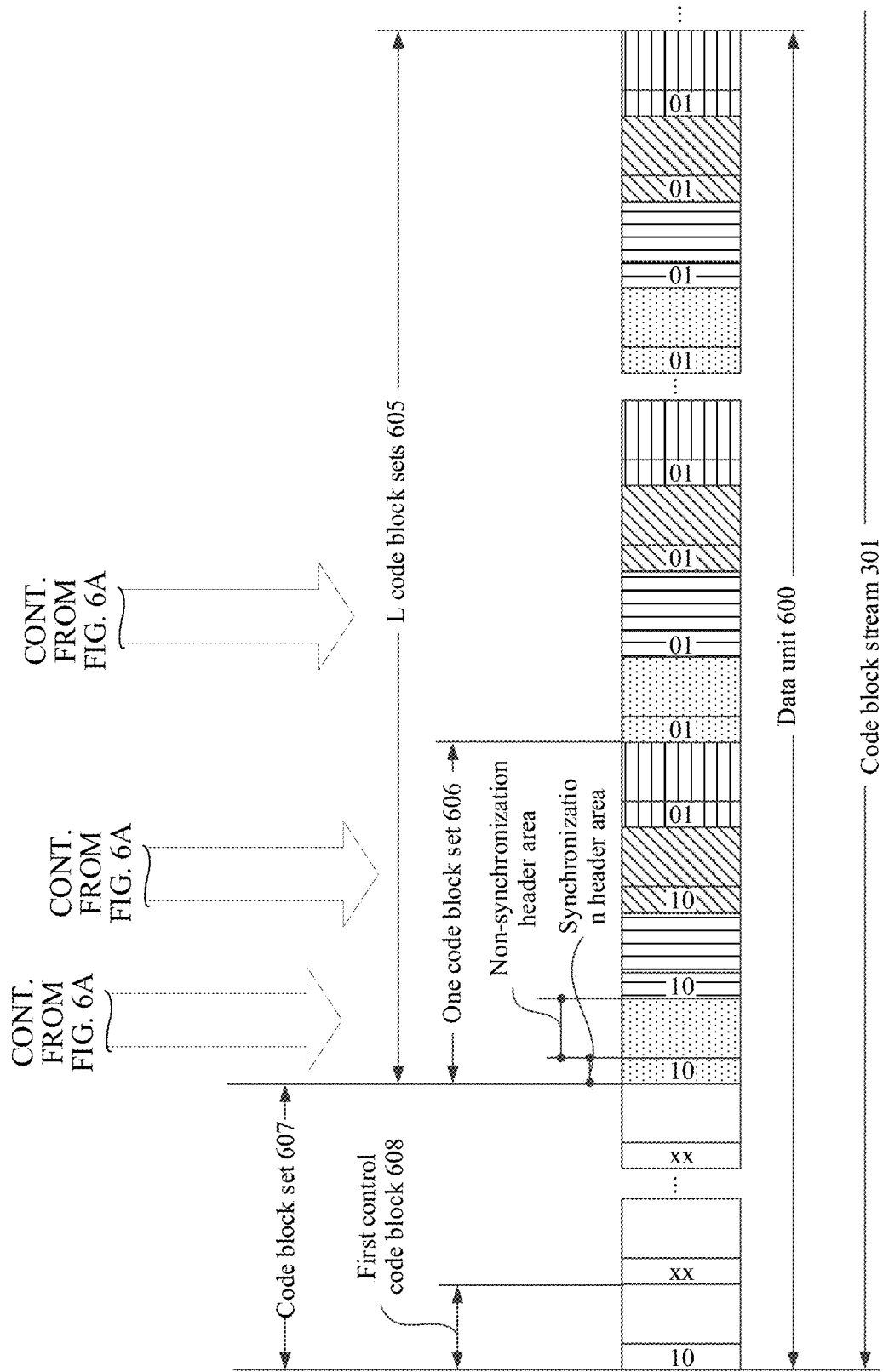

Based on the solutions shown in FIG. 4 and FIG. 5, FIG. 6A and FIG. 6B are an example of a schematic structural diagram of a second code block stream according to an embodiment of this application. FIG. 6A and FIG. 6B are described by using the access device 204 in FIG. 3 as an example. In FIG. 6A and FIG. 6B, Q is 3, and the Q first code block streams are the code block stream 3011, the code block stream 3012, and the code block stream 3013. The Q downlink ports are the port 2042, the port 2043, and the port 2044. The second code block stream is the code block stream 301. As shown in FIG. 6A and FIG. 6B, there are a control code block and a data code block in each first code block stream. Content carried in a synchronization header area of the control code block is 10, and content carried in a synchronization header area of the data code block is 01. FIG. 6A and FIG. 6B show only an example of a structure form of the Q first code block streams. A code block set in this embodiment of this application is a unit that includes one code block or includes a plurality of consecutive code blocks, for example, a code block set 607 and a code block set 606 shown in FIG. 6B. A data unit 600 in this embodiment of this application is a unit that includes one code block set or a plurality of consecutive code block sets, for example, the data unit 600 in FIG. 6B, and for another example, a data unit 800 shown in FIG. 8 in the following content. The second code block stream may include a plurality of data units.

As shown in FIG. 6A, the code block stream 3011 corresponds to one code block group, namely, a code block group 601. Therefore, a code block group identifier corresponding to each code block in the code block stream 3011 is the code block group 601. The code block stream 3012 corresponds to one code block group, namely, a code block group 602. Therefore, a code block group identifier corresponding to each code block in the code block stream 3012 is the code block group 602. The code block stream 3013 corresponds to two code block groups: a code block group 603 and a code block group 604. Therefore, a code block group identifier corresponding to a code block in the code block stream 3011 is the code block group 603 or the code block group 604. In one embodiment, when a first code block stream corresponds to a plurality of code block groups, a code block group identifier of a code block in the first code block stream may be determined by turns as one of a plurality of code block group identifiers. For example, in FIG. 6A, the code block stream 3013 corresponds to the two code block groups, and code block group identifiers of code blocks in the code block stream 3013 may be determined by turns as the code block group 603 and the code block group 604. In one embodiment, code block group identifiers of a plurality of consecutive code blocks may be determined by turns as the code block group 603 and the code block group 604. For example, code block group identifiers of two consecutive code blocks in the code block stream 3013 are determined as the code block group 603, code block group identifiers of subsequent two consecutive code blocks in the code block stream 3013 are determined as the code block group 604, then, code block group identifiers of subsequent two consecutive code blocks in the code block stream 3013 are determined as the code block group 603, and so on.

As shown in FIG. 6A and FIG. 6B, all code blocks in the L code block sets 605 included in the second code block stream are code blocks from the Q first code block streams. One code block set 606 includes K code blocks corresponding to each of S code block groups. In FIG. 6A and FIG. 6B, that K is 1 is used as an example. In actual application, K may alternatively be an integer greater than 1. When K is greater than 1, code blocks that belong to a same code block group and that are included in the code block set 606 may be consecutively placed, or may not be consecutively placed.

It can be learned from FIG. 6A and FIG. 6B that, for a code block multiplexed into the L code block sets 605, neither a non-synchronization header area nor a synchronization header area of the code block is changed. In this case, there may be one or more control type code blocks (which may also be referred to as control code blocks) in the L code block sets 605, and the control code blocks may be consecutive or spaced.

In one embodiment, the code blocks in the L code block sets are consecutively carried in the second code block stream, the second code block stream further includes one code block set in front of a header and/or behind a tail of the L code block sets, and a header of the code block set includes at least one first control code block. In this embodiment of this application, the code block set 607 and the L code block sets 605 may be referred to as the data unit 600. As shown in FIG. 6B, the code block set 607 is set in front of the header of the L code block sets 605. A person skilled in the art may understand that the code block set may alternatively be set behind the tail of the L code block sets. Alternatively, some code blocks in the code block set are set in front of the header, and some code blocks in the code block set are set behind the tail of the L code block sets. The code block set 607 may include only one first control code block 608, or may include one or more code blocks in addition to the first control code block 608. A code block in the code block set 607 other than the first control code block 608 may be a data code block, or may be a control code block. In FIG. 6B, a synchronization header area of the code block included in the code block set 607 other than the first control code block 608 is displayed as "xx", to indicate that the synchronization header area of the code block may be "10" or "01".

In the foregoing operation 402 and operation 502, in an embodiment, the first communications device cyclically performs a code block extraction operation for L times on the Q first code block streams, to obtain the second code block stream. For each of the L code block extraction operations, the first communications device sequentially extracts, from the Q first code block streams based on a sequence of the S code block groups, the K code blocks corresponding to each of the S code block groups. The sequence of the S code block groups may be predefined, or may be delivered by a core device.

In this embodiment of this application, storage space may be configured for a communications device, and may also be referred to as a buffer. The buffer may be a common buffer, or the buffer may be divided into a plurality of buffers based on addresses. In one embodiment, storage capacities of any two buffers are the same. In this way, a buffer may be configured for a downlink port of the communications device. When a data transmission rate corresponding to the downlink port is relatively high, bandwidth of the downlink port may be increased by configuring more buffers for the downlink port. When a data transmission rate corresponding to the downlink port is relatively low, bandwidth of the downlink port may be reduced by configuring fewer buffers for the downlink port. It can be learned that, in this embodiment, bandwidth of a port may be adjusted by using a buffer as a granularity, so that a port bandwidth adjustment granularity can be further reduced, and flexibility of FlexE can be further improved.

In the solutions shown in FIG. 4 and FIG. 5, optionally, the S code block groups correspond to S buffers, and the S code block groups are in a one-to-one correspondence with the S buffers. In one embodiment, that the first communications device obtains a to-be-sent second code block stream based on the Q first code block streams includes: The first communications device buffers code blocks in the Q first code block streams to the S buffers based on a correspondence between the S code block groups and the S buffers; and for a code block set in the L code block sets, the first communications device sequentially extracts K code blocks from each of the S buffers based on the sequence of the S code block groups, to obtain code blocks in the code block set.

Figure 7:
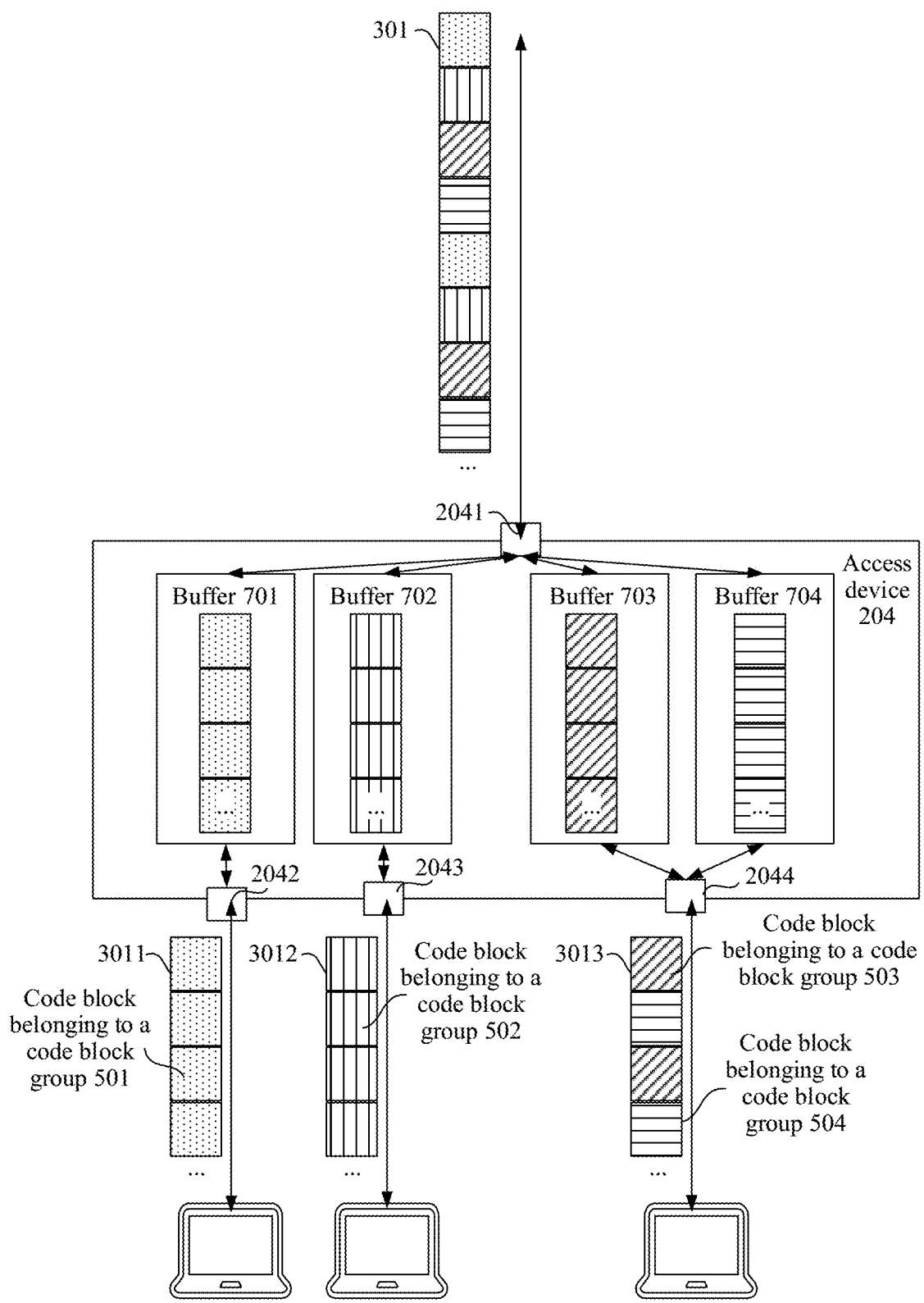
FIG. 7 is a schematic flowchart of a data transmission process according to an embodiment of this application.

FIG. 7 is an example of a schematic flowchart of a data transmission process according to an embodiment of this application. FIG. 7 is described by using the data transmission process shown in FIG. 6A and FIG. 6B as an example. As shown in FIG. 7, in an access device 204, a buffer 701 is allocated to a port 2042, a buffer 702 is allocated to a port 2043, and two buffers are allocated to a port 2044: a buffer 703 and a buffer 704. The buffer 703 may be configured to store a code block corresponding to a code block group 503, and the buffer 704 may be configured to buffer a code block corresponding to a code block group 504. As shown in FIG. 7, for each downlink port of the access device 204, the access device 204 buffers, to a corresponding buffer, a code block in a code block stream received by using the downlink port. In one embodiment, for a first code block stream in the Q first code block streams, when the first code block stream corresponds to one code block group, the first communications device buffers code blocks in the first code block stream to a buffer corresponding to the code block group. Alternatively, when the first code block stream corresponds to a plurality of code block groups, the first communications device sequentially buffers code blocks in the first code block stream by turns to a plurality of buffers corresponding to the plurality of code block groups. In this case, a concept of code block group may alternatively be ignored. The first communications device places by turns, in the plurality of buffers corresponding to a downlink port, the code blocks in the first code block stream received by using the downlink port. As shown in FIG. 7, the first communications device sequentially extracts K code blocks from each buffer based on a sequence of the buffers, to obtain code blocks in L code block sets in a second code block stream obtained after multiplexing. In FIG. 7, that K is 1 is used as an example. In actual application, K may be greater than 1.

In the solutions shown in FIG. 4 and FIG. 5, to further improve flexibility of the solutions, an idle code block may be flexibly added or deleted. In one embodiment, for each code block in the Q first code block streams, the first communications device discards the code block when a code block type of the code block is an idle idle code block. In actual application, an idle code block is usually sent between communications devices. In this case, when there is an idle code block in a first code block stream received by the access device 204 by using a downlink port, the access device 204 directly discards the idle code block, and does not buffer the idle code block to a buffer. In this way, a buffer capacity can be saved, and transmission of a large quantity of idle code blocks can be avoided, thereby reducing network load. In addition, because the first communications device deletes all idle code blocks in the received first code block streams, a ratio of valid data carried in the second code block stream may increase. Therefore, bandwidth of the uplink port of the first communications device may be set to be different from total bandwidth of the Q downlink ports of the first communications device. In this way, rate convergence of the uplink port and the downlink ports of the first communications device can be achieved. Further, the bandwidth of the uplink port of the first communications device can be flexibly set. Therefore, the bandwidth of the uplink port can be reduced based on a particular situation, and costs can be further reduced without affecting user data transmission. The bandwidth of the uplink port of the first communications device may be represented by a capacity of a buffer corresponding to a downlink port, of another communications device, connected to the uplink port. In this case, this may also be described as follows: The capacity of the buffer corresponding to the downlink port, of the another communications device, connected to the uplink port of the first communications device may be set to be inconsistent with the total bandwidth of the Q downlink ports of the first communications device. As shown in FIG. 7, a total buffer capacity of the buffer 701, the buffer 702, the buffer 703, and the buffer 704 of the access device 204 may be different from a total capacity of a buffer corresponding to the downlink port 2032 (refer to FIG. 3) of the aggregation device 203.

As shown in FIG. 7, in an embodiment, when no code block is extracted in a process of cyclically performing the code block extraction operation for L times, an idle idle code block is inserted into the second code block stream. With reference to FIG. 7, for example, L is 5. The buffer 702 currently includes only one code block, but there is no more code block in the buffer 702 (for example, all code blocks transmitted in the code block stream 3012 are idle code blocks, are discarded by the access device 204, and are not placed in the buffer 702). The access device 204 sequentially obtains four code blocks from the four buffers (the four buffers are the buffer 701, the buffer 702, the buffer 703, and the buffer 704), to obtain four code blocks in the first code block set in the L code block sets. Then, when the access device 204 performs the second round of code block extraction operation, there is no code block in the buffer 702. In this case, the idle code block is inserted at a location corresponding to the code block in the buffer 702 in the second code block set in the second code block stream.

Figure 8:
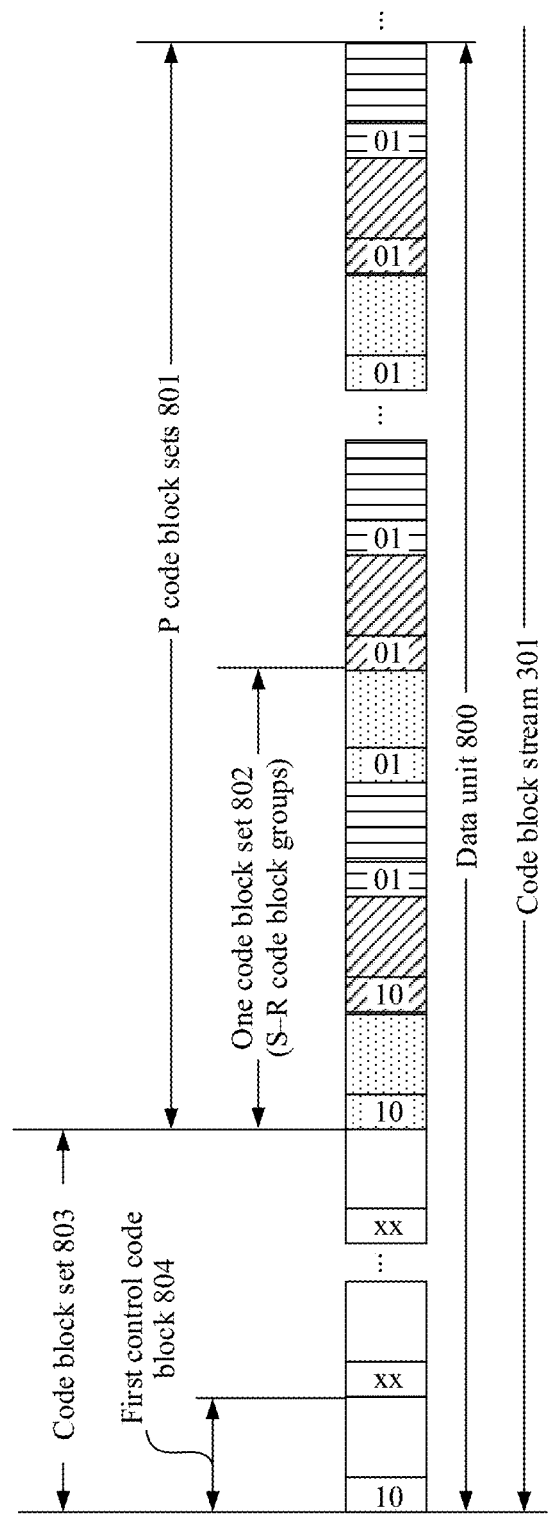
FIG. 8 is another schematic structural diagram of a second code block stream according to an embodiment of this application.

The second code block stream may alternatively have another structure form. FIG. 8 is an example of another schematic structural diagram of the second code block stream according to an embodiment of this application. In one embodiment, when R code block groups in the S code block groups meet a preset condition, the second code block stream further includes P code block sets, where P is a positive integer, and for each of the P code block sets, the code block set includes K code blocks corresponding to each of (S−R) code block groups; R is a positive integer not greater than S; the (S−R) code block groups are code block groups in the S code block groups other than the R code block groups; and that a code block group in the R code block groups meets the preset condition means that K*L consecutive code blocks corresponding to the code block group are idle code blocks. In other words, when no code block is obtained in a process of cyclically performing the code block extraction operation, and in one embodiment, for a buffer, when no code block is extracted in the L code block extraction operations, the second code block stream may not carry a code block in the buffer.

FIG. 8 is another schematic structural diagram of the second code block stream based on FIG. 7. As shown in FIG. 8, the code block extraction operation needs to be performed for P times currently, to generate P code block sets in the second code block stream. However, in the P code block extraction operations, no code block is extracted from the buffer 702. In this case, as shown in FIG. 8, each code block set 803 in the P code block sets 801 in the code block stream 301 (the second code block stream) may not include a code block corresponding to the buffer 702. In this embodiment of this application, the code block including a code block set 803 and the P code block sets may be referred to as a data unit 800. In this way, a data transmission volume can be reduced, and network load can be further reduced. In one embodiment, as shown in FIG. 8, one code block set 803 may be further included in front of a header and/or behind a tail of the P code block sets 801, a header of the code block set 803 includes a first control code block 804, the code block set may further include one or more other code blocks, and a code block in the other code blocks may be a data code block, or a control code block.

Figure 9:
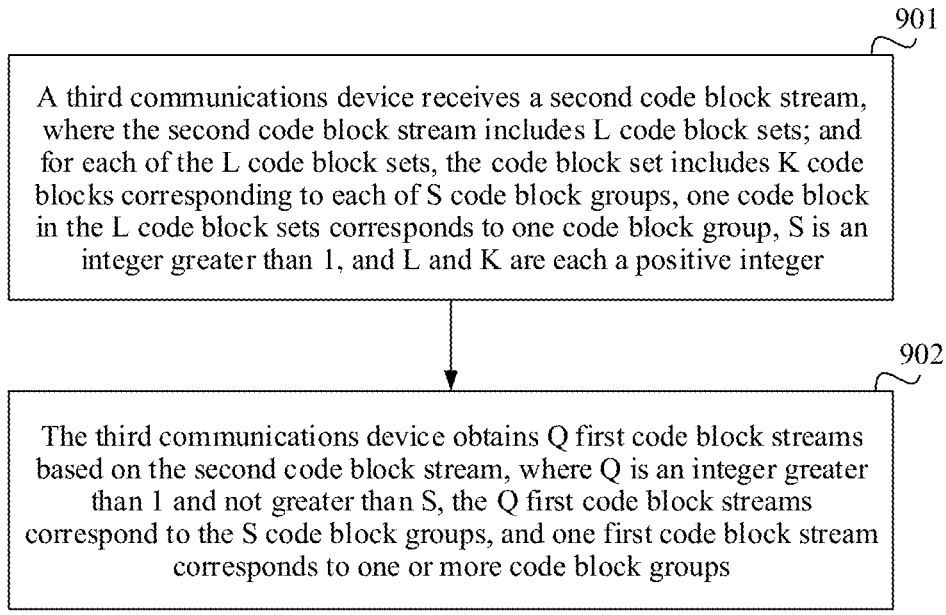
FIG. 9 is a schematic flowchart of a data transmission method according to an embodiment of this application.
Figure 10:
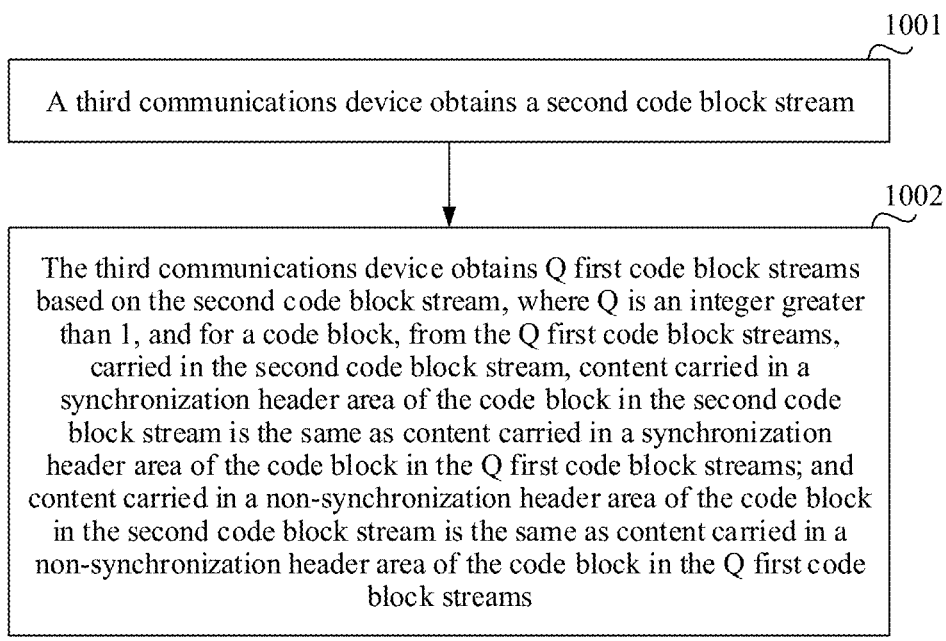
FIG. 10 is a schematic flowchart of another data transmission method according to an embodiment of this application.

Based on the content shown in FIG. 2 to FIG. 8, FIG. 9 and FIG. 10 are examples of schematic flowcharts of two data transmission methods according to the embodiments of this application. The methods shown in FIG. 9 and FIG. 10 are both demultiplexing side methods. For ease of description, the methods shown in FIG. 9 and FIG. 10 are described by using an example in which a second code block stream needs to be demultiplexed. In the example, the second code block stream may be demultiplexed into Q first code block streams. With reference to FIG. 3, in a procedure of the demultiplexing side method, when the second code block stream is the code block stream 30, the Q first code block streams may be the code block stream 301, the code block stream 302, and the code block stream 303 in FIG. 3. When the second code block stream is the code block stream 301, the Q first code block streams may be the code block stream 3011, the code block stream 3012, and the code block stream 3013 in FIG. 3.

As shown in FIG. 9, the method includes the following operations.

Operation 901: A third communications device obtains the second code block stream, where the second code block stream includes L code block sets; and for each of the L code block sets, the code block set includes K code blocks corresponding to each of S code block groups, one code block in the L code block sets corresponds to one code block group, S is an integer greater than 1, and L and K are each a positive integer.

The third communications device performing the solutions shown in FIG. 9 may be, for example, the access device or the aggregation device performing the demultiplexing process in the downlink data transmission process in FIG. 2 and FIG. 3. In this case, the third communications device may receive the second code block stream by using an uplink port. Alternatively, the third communications device performing the solutions shown in FIG. 9 may be the core device performing the demultiplexing process in the uplink data transmission process in FIG. 2 and FIG. 3, and the core device may perform multi-level demultiplexing on the code block stream.

Operation 902: The third communications device obtains the Q first code block streams based on the second code block stream, where Q is an integer greater than 1 and not greater than S, the Q first code block streams correspond to the S code block groups, and one first code block stream corresponds to one or more code block groups.

As shown in FIG. 10, the method includes the following operations.

Operation 1001: A third communications device obtains the second code block stream.

In operation 1001, for a role of the third communications device in actual application, refer to related descriptions of the foregoing operation 901. Details are not described herein again.

Operation 1002: The third communications device obtains the Q first code block streams based on the second code block stream, where Q is an integer greater than 1, and for a code block, from the Q first code block streams, carried in the second code block stream, content carried in a synchronization header area of the code block in the second code block stream is the same as content carried in a synchronization header area of the code block in the Q first code block streams; and content carried in a non-synchronization header area of the code block in the second code block stream is the same as content carried in a non-synchronization header area of the code block in the Q first code block streams.

FIG. 9 and FIG. 10 describe the demultiplexing procedure. For related structures of the second code block stream and the first code block stream in FIG. 9 and FIG. 10, refer to related descriptions in FIG. 6A and FIG. 6B, FIG. 7, and FIG. 8. Details are not described herein again.

Based on the solutions shown in FIG. 9 and FIG. 10, the third communications device performing the solutions shown in FIG. 9 and FIG. 10 has a plurality of roles. In a first case, when the third communications device is not a core device, for example, the third communications device may be the access device or the aggregation device that performs the demultiplexing process in the uplink data transmission process in FIG. 2 and FIG. 3, Q downlink ports in FIG. 9 and FIG. 10 may be Q downlink ports of the third communications device, and the third communications device may deliver the Q first code block streams by using the Q downlink ports of the third communications device.

When the third communications device is not a core device, the third communications device obtains the second code block stream in a plurality of manners. When receiving the second code block stream by using an uplink port, the third communications device may receive the second code block stream by using one or more uplink ports. When a communications device on a sending side sends the second code block stream by using a plurality of downlink ports, the communications device on the sending side may use a data unit as a granularity of the second code block stream, and sends data units in a sequence of the data units in the second code block stream by using the plurality of uplink ports by turns. Alternatively, a corresponding uplink port may be allocated to each data unit according to a rule, and then each data unit is sent by using the uplink port corresponding to the data unit. Correspondingly, after receiving the data units of the second code block stream by using a plurality of downlink ports, the third communications device (a communications device on a receiver side) restores the second code block stream based on the sequence of sending the data units on the sending device side.

In a second case, the third communications device performing the solutions shown in FIG. 9 or FIG. 10 may alternatively be the core device performing the demultiplexing process in the downlink data transmission process in FIG. 2 and FIG. 3, and the core device may perform one-level or multi-level multiplexing on the code block streams. In this case, the Q downlink ports are Q downlink ports of a communications device that demultiplexes the Q first code block streams in the downlink transmission process. An example is described with reference to FIG. 3. For example, when the Q first code block streams are code block streams sent by Q terminal devices (where the Q first code block streams are the code block stream 3011, the code block stream 3012, and the code block stream 3013), and the Q downlink ports are Q downlink ports of a communications device connected to the Q terminal devices (in one embodiment, the Q downlink ports are the downlink port 2042, the downlink port 2043, and the downlink port 2044 of the access device 204). For another example, when the Q first code block streams are code block streams sent by Q access devices (where the Q first code block streams are code block stream 301, code block stream 302, and code block stream 303), and the Q downlink ports are Q downlink ports of a communications device connected to the Q access devices (in one embodiment, the Q downlink ports are the downlink port 2032, the downlink port 2033, and the downlink port 2034 of the aggregation device 203).

In the demultiplexing solutions shown in FIG. 9 and FIG. 10, an embodiment is provided. When the third communications device is not a core device, a value of S is a total quantity of code block groups corresponding to the Q downlink ports in the downlink data transmission process, and each of the S code block groups is a code block group corresponding to the Q downlink ports in the downlink data transmission process. When the third communications device is a core device, a value of S is a total quantity of code block groups corresponding to the Q downlink ports in the uplink data transmission process, and each of the S code block groups is a code block group corresponding to the Q downlink ports in the uplink data transmission process.

In the embodiments of this application, in the foregoing operation 902 and operation 1002, that the third communications device obtains Q first code block streams based on the second code block stream includes: For each of the L code block sets, the third communications device sequentially extracts, from the code block set based on a sequence of the S code block groups, K code blocks corresponding to each of the S code block groups, to obtain the Q first code block streams. Descriptions are provided with reference to FIG. 6A and FIG. 6B. In FIG. 6A and FIG. 6B, the second code block stream is the code block stream 301, and the Q first code block streams are respectively the code block stream 3011, the code block stream 3012, and the code block stream 3013. In a process in which the second code block stream needs to be demultiplexed, for code blocks in the L code block sets 605 in the second code block stream, the code blocks are sequentially extracted from the second code block stream, and each extracted code block may be sent by using a corresponding downlink port based on the downlink port corresponding to a code block group of the code block.

In one embodiment, a buffer is not used in the downlink data transmission process. In other words, after receiving the second code block stream by using the uplink port, the third communications device directly extracts the code blocks from the L code block sets of the second code block stream, and sends the code blocks by using the downlink ports corresponding to the code blocks. In one embodiment, a buffer is used in the downlink data transmission process. In one embodiment, the third communications device buffers, based on a correspondence between the S code block groups and S buffers, the K code blocks corresponding to each of the S code block groups to a buffer corresponding to the code block group. In one embodiment, the code blocks are then extracted from the buffer, and are sent by using a downlink port. An example is described with reference to FIG. 7, after receiving the second code block stream (the code block stream 301), the access device 204 places each code block in the L code block sets in the second code block stream to a buffer corresponding to the code block, and then sends, by using a corresponding downlink port, a code block buffered in each buffer. For example, a code block in the buffer 701 is sent by using the port 2042. In a special case, the port 2044 corresponds to a plurality of buffers. In this case, demultiplexing is performed according to a rule that matches a multiplexing process, to obtain a first code block stream corresponding to the port 2044. In the example in FIG. 7, code blocks may be extracted from the buffer 703 and the buffer 704 by turns, and are sent by using the port 2044.

In addition to the foregoing content, for other content about the demultiplexing side, refer to related descriptions of the foregoing multiplexing side. Details are not described herein again.

FIG. 2 to FIG. 10 describe method procedures on the multiplexing side and the demultiplexing side provided in the embodiments of this application. In one embodiment, based on the centralized architecture shown in FIG. 2, a centralized negotiation manner may be further provided. In this negotiation manner, a core device may deliver configuration information in a centralized manner (the configuration information may include, for example, a correspondence between a port and a code block group; because one port is used to transmit one code block stream, the correspondence between a port and a code block group may alternatively be described as a correspondence between a code block stream and a code block group; when a buffer is configured in a communications device, the correspondence between a port and a code block group may alternatively be described as a correspondence between a buffer and a port), so that a ratio of negotiation failures can be reduced, thereby improving network running efficiency. For example, the core device may configure bandwidth of a port of each level of communications device (for example, including an aggregation device and an access device) in a centralized manner. In one embodiment, the bandwidth configured for the port may be represented by a buffer configured for the port.

Figure 11A:
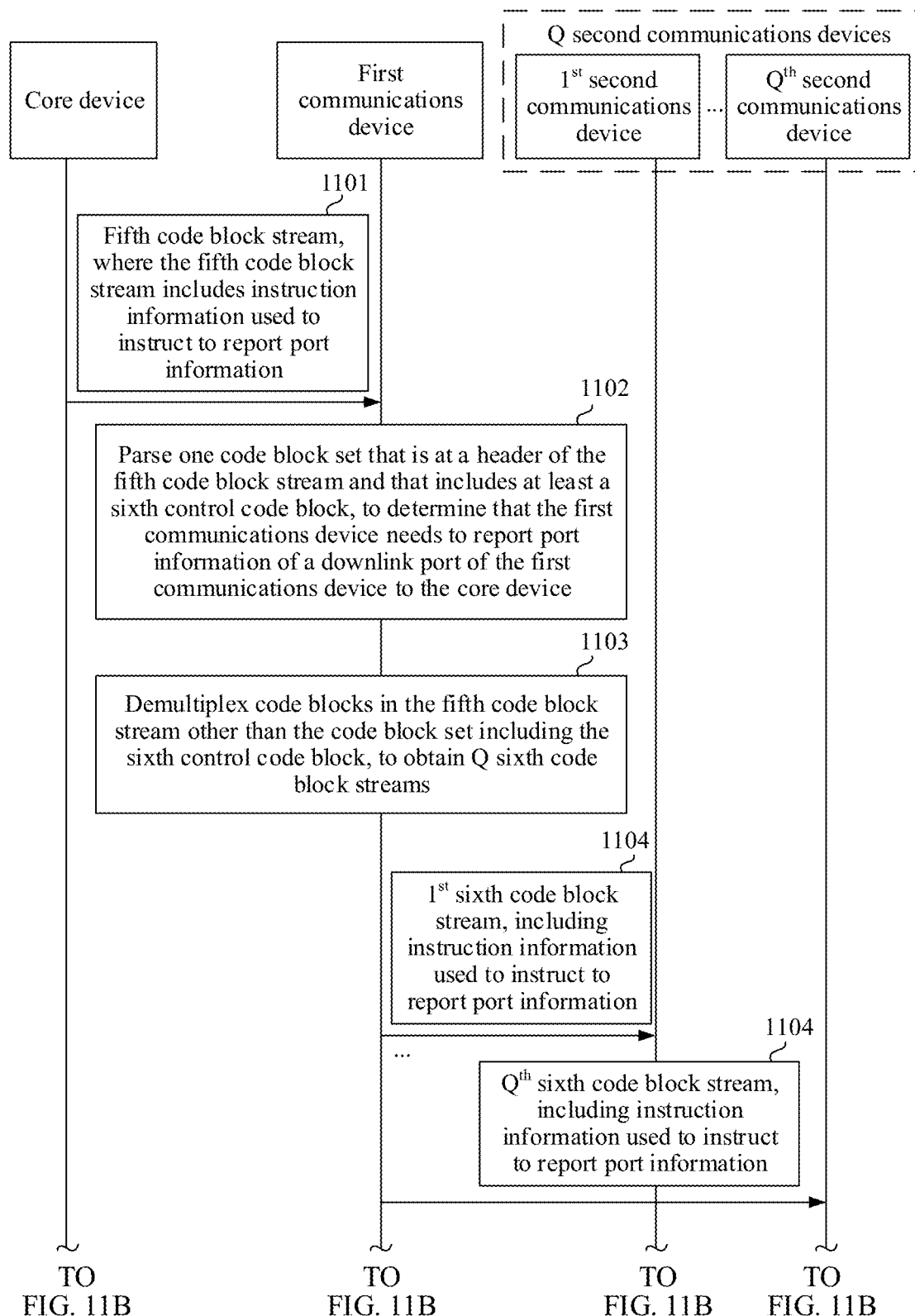
FIG. 11A and FIG. 11B are a schematic flowchart of a negotiation method according to an embodiment of this application.
Figure 11B:
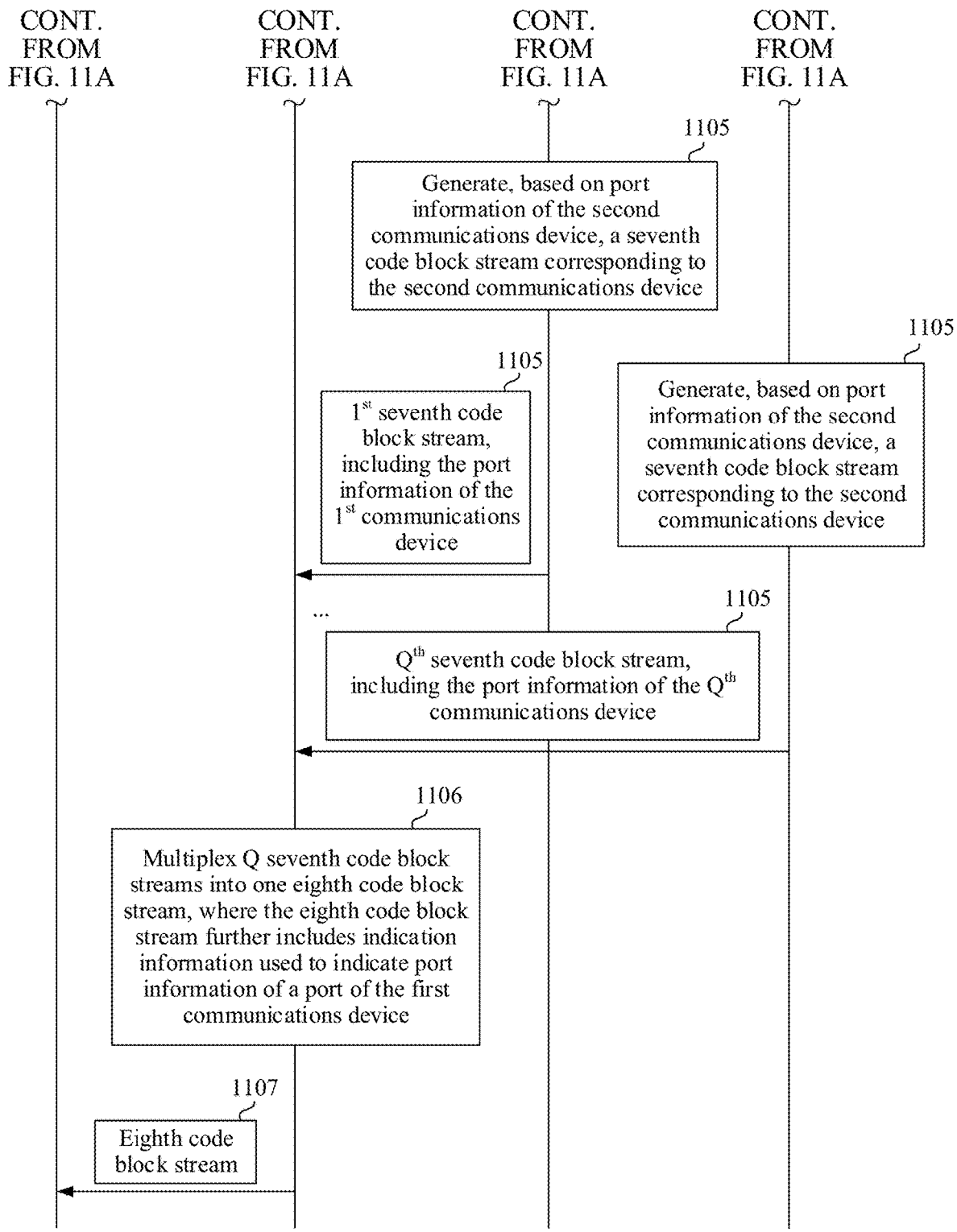

FIG. 11A and FIG. 11B and FIG. 12A and FIG. 12B are each an example of a schematic flowchart of a negotiation method according to an embodiment of this application. For ease of description, in FIG. 11A and FIG. 11B or FIG. 12A and FIG. 12B, an example in which a core device is connected to a first communications device and the first communications device is connected to Q second communications devices is used for description. In FIG. 11A and FIG. 11B or FIG. 12A and FIG. 12B, the $1^{st}$ second communications device, . . . , and the $Q^{th}$ second communications device are used as an example of the Q second communications devices. As shown in FIG. 11A and FIG. 11B, the method includes the following operations.

Operation 1101: The core device sends a fifth code block stream, where the fifth code block stream includes instruction information used to instruct to report port information.

In this embodiment of this application, states of a port may be classified into an up state and a down state. When the port is in the up state, it indicates that the port is in an available state; and when the port is in the down state, it indicates that the port is in an unavailable state. The core device includes one or more downlink ports, and all or some of the downlink ports of the core device are in the up state. In one embodiment, the core device delivers the fifth code block stream by using a downlink port in the up state. In one embodiment, one downlink port of the core device is connected to one first communications device. In this embodiment of this application, one first communications device is used as an example for description.

In this embodiment of this application, port information of a port may include any one or more of the following content: state information of the port (in one embodiment, whether the port is in the up state or the down state), a port rate, a port identifier, and the like.

Operation 1102: The first communications device receives the fifth code block stream, and parses one code block set that is at a header of the fifth code block stream and that includes at least a sixth control code block, to determine that the first communications device needs to report port information of a downlink port of the first communications device to the core device.

The sixth control code block includes instruction information used to instruct the first communications device to report the port information of the first communications device. For example, a bit may be set at a preset position in the sixth control code block, and when a value of the bit is 7, it indicates that the port information needs to be reported.

In this embodiment of this application, in the example shown in FIG. 11A and FIG. 11B, the core device may require the communications device to report only the port information of the downlink port, or may require the communications device to report port information of an uplink port and the port information of the downlink port.

In this embodiment of this application, a code block set including at least one control code block in a code block stream may be located at a header or a tail of the code block stream. Alternatively, some code blocks in the code block set including the control code block are located at the header of the code block stream, and some code blocks are located at the tail of the code block stream. An example in which the code block set is located at the header is used for description in FIG. 11A and FIG. 11B and FIG. 12A and FIG. 12B. For example, a code block set including a third control code block may be located at a header or a tail of a third code block stream, or some code blocks in the code block set are located at the header of the third code block stream, and some code blocks are located at the tail of the third code block stream. For another example, a code block set including a fourth control code block may be located at a header or a tail of a fourth code block stream, or some code blocks in the code block set are located at the header of the fourth code block stream, and some code blocks are located at the tail of the fourth code block stream. In this embodiment of this application, there are other code block sets including at least one control code block, for example, a location of the code block set including at least one sixth control code block in the fifth code block stream, a location of a code block set including at least one seventh control code block in a sixth code block stream, a location of a code block set including at least one eighth control code block in a seventh code block stream, a location of a code block set including at least one ninth control code block in an eighth code block stream, and the like. For the locations, refer to the descriptions in this paragraph, and details are not repeated elsewhere.

In this embodiment of this application, a code block set including at least one control code block in a code block stream may not include another code block (in other words, only the control code block is included), or may include another code block (where the another code block may be a data code block, or may be a control code block). For example, the code block set including the third control code block may include only the third control code block, or may include another data code block and/or control code block in addition to the third control code block.

Operation 1103: The first communications device demultiplexes code blocks in the fifth code block stream other than the code block set including the sixth control code block, to obtain Q sixth code block streams.

The Q sixth code block streams are in a one-to-one correspondence with the Q downlink ports. In this embodiment of this application, an example in which the first communications device is connected to the Q second communications devices by using the Q downlink ports, and the Q downlink ports are in a one-to-one correspondence with the Q second communications devices is used for description.

Operation 1104: The first communications device distributes the Q sixth code block streams to the Q second communications devices by using the Q downlink ports. The sixth code block stream includes instruction information used to instruct to report port information.

In FIG. 11A and FIG. 11B, the $1^{st}$ sixth code block stream, . . . , and the $Q^{th}$ sixth code block stream are used as an example of the Q sixth code block streams in operation 1104.

Correspondingly, second communications device in the Q second communications devices receives one sixth code block stream by using a downlink port that is on the first communications device and that is connected to the second communications device.

In one embodiment, for a code block stream in the Q sixth code block streams, a header of the sixth code block stream includes one code block set, the code block set includes at least one seventh control code block, and the code block set including the seventh control code block includes: instruction information used to instruct a second communications device corresponding to the sixth code block stream to report port information of the second communications device.

Operation 1105: Each of the Q second communications devices generates, based on port information of the second communications device, a seventh code block stream corresponding to the second communications device. The Q second communications devices respectively send the seventh code block streams to the first communications device. The seventh code block stream includes port information of the communications devices.

In FIG. 11A and FIG. 11B, the $1^{st}$ seventh code block stream, . . . , and the $Q^{th}$ seventh code block stream are used as an example of the Q seventh code block streams in operation 1104.

Correspondingly, the first communications device receives the Q seventh code block streams.

In one embodiment, for a seventh code block stream in the Q seventh code block streams, a header of the seventh code block stream includes one code block set, the code block set includes at least one eighth control code block, and the code block set including the eighth control code block includes: indication information used to indicate port information of a port of a second communications device corresponding to the seventh code block stream.

Operation 1106: The first communications device multiplexes the Q seventh code block streams into one eighth code block stream.

In one embodiment, one code block set is added to a header and/or a tail of the eighth code block stream, and a header of the code block set includes at least one ninth control code block. The code block set including the ninth control code block includes indication information used to indicate the port information of the port of the first communications device.

Operation 1107: The first communications device sends the eighth code block stream to the core device.

Correspondingly, the core device receives the eighth code block stream, and performs multi-level demultiplexing on the eighth code block stream to obtain port information of each level of communications device (including the first communications device and the Q second communications devices).

Figure 12A:
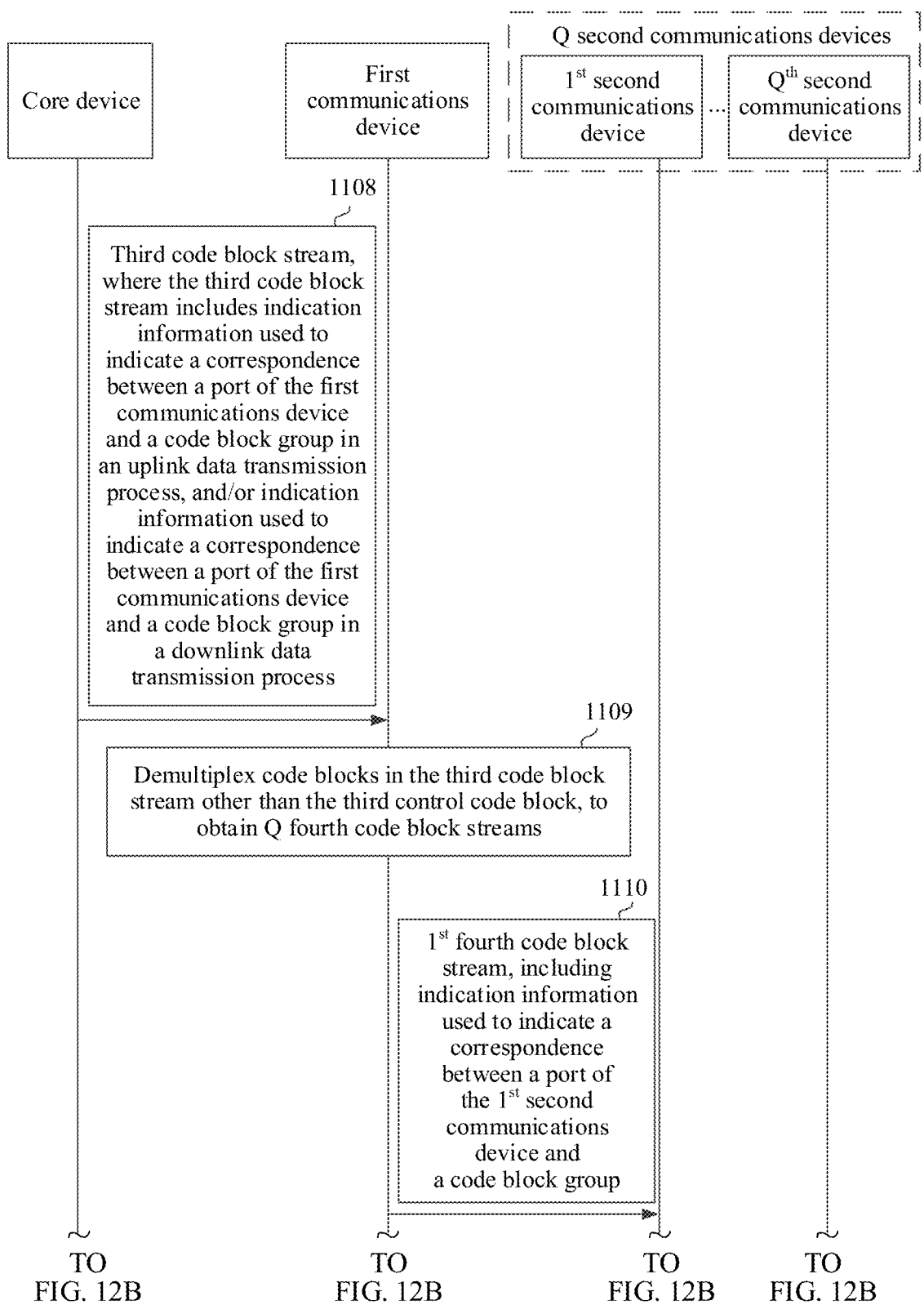
FIG. 12A and FIG. 12B are a schematic flowchart of a negotiation method according to an embodiment of this application.
Figure 12B:
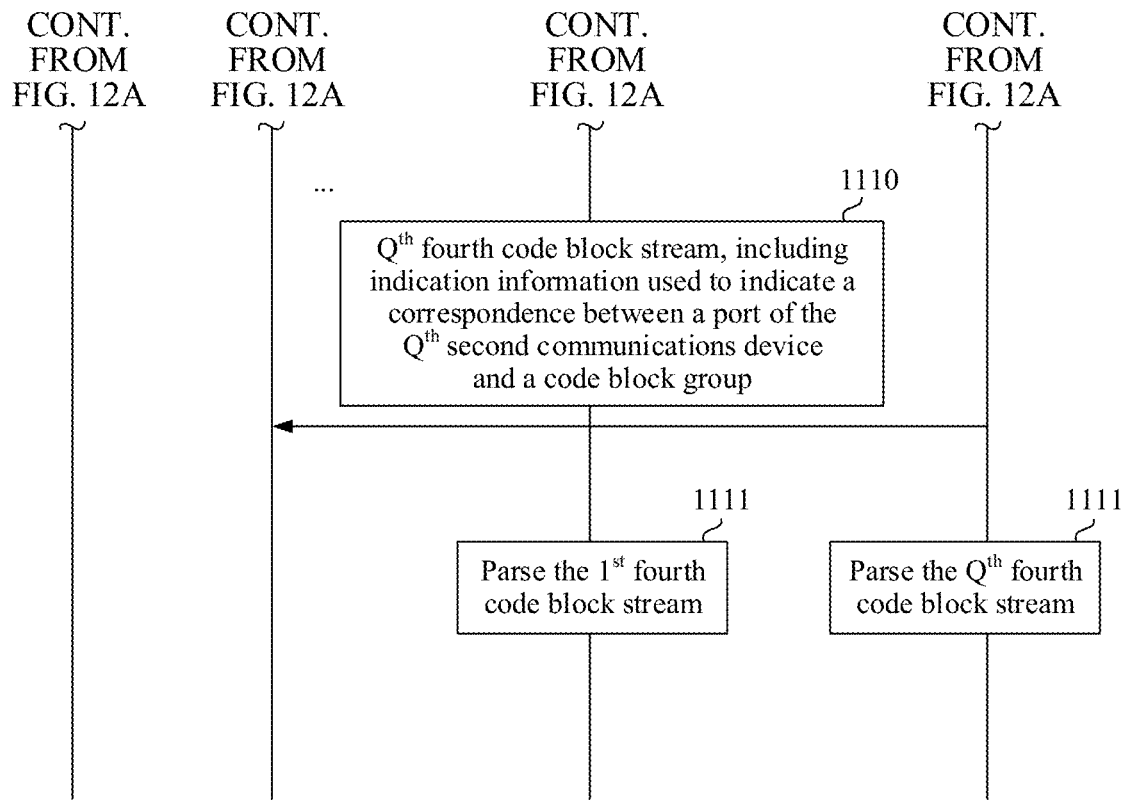

Operation 1108 in FIG. 12A may be performed after operation 1107.

Operation 1108: The core device sends a third code block stream. The third code block stream includes: indication information used to indicate a correspondence between a port of the first communications device and a code block group in an uplink data transmission process, and/or indication information used to indicate a correspondence between a port of the first communications device and a code block group in a downlink data transmission process.

In one embodiment, the correspondence between a port of the first communications device and a code block group in the uplink data transmission process may be the same as or different from the correspondence between a port of the first communications device and a code block group in the downlink data transmission process. Either of the correspondence between a port of the first communications device and a code block group in the uplink data transmission process and the correspondence between a port of the first communications device and a code block group in the downlink data transmission process may be configured and delivered by the core device, or may be configured and reported by the first communications device.

Correspondingly, the first communications device receives the third code block stream sent by the core device.

The third code block stream may carry configuration information allocated by the core device to a port of each communications device. In this embodiment of this application, the configuration information allocated by the core device to a port may include: a code block group allocated to the port and/or a buffer allocated to the port. The code block group allocated to the port may be represented by a code block group identifier allocated to the port, one or more code block groups may be allocated to the port, and the code block group allocated to the port may also be described as a correspondence between the port and the code block group. The buffer allocated to the port may be represented by a buffer address allocated to the port, one or more buffers may be allocated to the port, and the buffer allocated to the port may also be described as a correspondence between the port and the buffer. A header and/or a tail of the third code block stream include/includes a code block set, and the code block set includes at least one third control code block. The indication information used to indicate the correspondence between a downlink port of the first communications device and a code block group in the uplink data transmission process and/or the indication information used to indicate the correspondence between a downlink port of the first communications device and a code block group in the downlink data transmission process may be all carried on the third control code block, or some of the indication information is carried on the third control code block, and the remaining part is carried on another data code block and/or control code block in the code block set including the third control code block.

In this part of content, the first communications device is used as an example to describe the correspondence between a port and a code block group in the uplink data transmission process and the downlink data transmission process. If such content is involved in the following content, reference may be made to this part. Details are not described again.

In this embodiment of this application, the core device may allocate configuration information to a port based on a plurality of factors, and set different weights for the various factors. For example, the core device allocates the configuration information to the port based on a traffic volume corresponding to the port, a priority of a service corresponding to the port, a priority of the port, and a service type corresponding to the port. The service type corresponding to the port may include a video type, a voice service, a signaling level service, an Internet protocol television (IPTV) service, a wireless fidelity (Wi-Fi) service, and the like.

Correspondingly, when the code block set including the third control code block carries the correspondence between a port of the first communications device and a code block group in the uplink data process, the first communications device determines, based on the code block set including the third control code block, the correspondence between a downlink port of the first communications device and a code block group in the uplink data process. When the code block set including the third control code block carries the correspondence between a port of the first communications device and a code block group in the downlink data process, the first communications device determines, based on the code block set including the third control code block, the correspondence between a port of the first communications device and a code block group in the downlink data process.

Operation 1109: The first communications device demultiplexes code blocks in the third code block stream other than the code block set including the third control code block, to obtain Q fourth code block streams.

Operation 1110: The first communications device distributes the Q fourth code block streams by using the Q downlink ports. A fourth code block stream includes indication information used to indicate a correspondence between a code block group and a port of a second communications device corresponding to the fourth code block stream in the uplink data transmission process, and/or indication information used to indicate a correspondence between a code block group and a port of a second communications device corresponding to the fourth code block stream in the downlink data transmission process.

In FIG. 11A and FIG. 11B, the $1^{st}$ fourth code block stream, ..., and the $Q^{th}$ fourth code block stream are used as an example of the Q fourth code block streams in operation 1110.

Correspondingly, each of the Q second communications devices receives one fourth code block stream by using a downlink port that is on the first communications device and that is connected to the second communications device.

In one embodiment, the Q fourth code block streams are in a one-to-one correspondence with the Q downlink ports. In one embodiment, for a fourth code block stream in the Q fourth code block streams, a header and/or a tail of the fourth code block stream include/includes one code block set, and the code block set includes at least one fourth control code block. The indication information used to indicate the correspondence between a code block group and a port of a second communications device corresponding to the fourth code block stream in the uplink data transmission process, and the indication information used to indicate the correspondence between a code block group and a port of a second communications device corresponding to the fourth code block stream in the downlink data transmission process may be all carried on the fourth control code block, or some of the indication information is carried on the fourth control code block.

Operation 1111: A second communications device in the Q second communications devices parses a fourth code block stream received by the second communications device.

When the code block set including the fourth control code block carries the correspondence between a port of the second communications device and a code block group in the uplink data process, the second communications device determines, based on the code block set including the fourth control code block, the correspondence between a port of the second communications device and a code block group in the uplink data process. When the code block set including the fourth control code block carries the correspondence between a port of the second communications device and a code block group in the downlink data process, the second communications device determines, based on the code block set including the fourth control code block, the correspondence between a port of the second communications device and a code block group in the downlink data process.

The foregoing examples in FIG. 11A and FIG. 11B and FIG. 12A and FIG. 12B are described by using the first communications device as an example. In the foregoing content, an execution body on a demultiplexing side is the third communications device. The third communications device and the first communications device may be a same communications device, or may be two different communications devices. This is not limited in the embodiments of this application. When the first communications device performs a demultiplexing process, solutions performed by the first communications device are the same as the solutions performed by the third communications device. Correspondingly, when the third communications device performs a multiplexing process, solutions performed by the third communications device is the same as the solutions performed by the first communications device. In the examples in FIG. 11A and FIG. 11B and FIG. 12A and FIG. 12B, if the third communications device serves as the execution body, optionally, the second code block stream further includes one code block set in front of a header and/or behind a tail of the L code block sets, the code block set includes at least one first control code block, and the code block set including the first control code block includes: indication information used to indicate a correspondence between the Q downlink ports of the third communications device and the S code block groups in the uplink data transmission process, and/or indication information used to indicate a correspondence between the Q downlink ports of the third communications device and the S code block groups in the downlink data transmission process. That the third communications device obtains Q first code block streams based on the second code block stream includes: The third communications device obtains the correspondence between the Q downlink ports and the S code block groups based on the code block set including the first control code block; and the third communications device demultiplexes the L code block sets into the Q first code block streams based on the correspondence between the Q downlink ports and the S code block groups. In one embodiment, if the third communications device further includes a port other than the Q downlink ports, the code block set including the first control code block further includes: indication information used to indicate a correspondence between a code block group and the port of the third communications device other than the Q downlink ports in the uplink data transmission process and/or indication information used to indicate a correspondence between a code block group and the port of the third communications device other than the Q downlink ports in the downlink data transmission process.

Further, in an embodiment, the third communications device is connected to Q fourth communications devices by using the Q downlink ports, and the Q downlink ports are in a one-to-one correspondence with the Q fourth communications devices. After that the third communications device obtains Q first code block streams based on the second code block stream, the method further includes: The third communications device distributes the Q first code block streams by using the Q downlink ports, where a header and/or a tail of a first code block stream include/includes one code block set, the code block set includes at least one fifth control code block, and the code block set including the fifth control code block includes: indication information used to indicate a correspondence between a code block group and a port, of the fourth communications device, corresponding to the first code block stream in the uplink data transmission process, and/or indication information used to indicate a correspondence between a code block group and a port, of the fourth communications device, corresponding to the first code block stream in the downlink data transmission process.

The foregoing multiplexing process and demultiplexing process in the negotiation process are consistent with the content described in FIG. 2 to FIG. 10. Details are not described herein again. It can be learned from the examples shown in FIG. 11A and FIG. 11B and FIG. 12A and FIG. 12B that after obtaining the port information of each level of communications device, the core device may allocate a code block group to the port of each level of communications device in a centralized manner (in some embodiments, allocating the code block group to the port may also be described as: allocating a buffer to the port, or allocating bandwidth to the port), and delivers, to each level of communications device, the code block groups allocated to the port. In the solutions, a centralized architecture is used in FlexE, so that a negotiation success rate can be improved, and a problem of a relatively high negotiation failure rate caused when the bandwidth of the port is negotiated between every two parties in the existing FlexE technology can be resolved.

FIG. 11A and FIG. 11B and FIG. 12A and FIG. 12B describe an example in which the core device configures the code block group for each level of communications device. In one embodiment, the core device may further reconfigure a code block group for one or more ports of a communications device, for example, configure a new code block group for a port or delete a code block group already configured for a port. Reconfiguration of the code block group may be initiated by the core device and the core device delivers reconfigured configuration information to the communications device. Alternatively, the communications device initiates and uses the reconfiguration, and reports used new configuration information to the core device. For example, if the first communications device finds that bandwidth of a downlink port is insufficient, the first communications device adds a code block group for the downlink port, and adds, to the header and/or the tail of the L code block sets in the second code block stream, indication information used to indicate the port and the code block group.

In one embodiment, there are a plurality of conditions for initiating the reconfiguration, for example, change of a priority of the port, or change of a traffic volume of the port, and for another example, a volume of buffered data. If the first communications device initiates the reconfiguration, in an embodiment, for a downlink port of the Q downlink ports, when a volume of buffered data in a buffer corresponding to the downlink port is greater than a first buffer volume threshold or less than a second buffer volume threshold, the second code block stream further includes one code block set in front of a header and/or behind a tail of the L code block sets, a header of the code block set includes at least one second control code block, the second control code block includes instruction information used to instruct to request the core device to reconfigure a code block group for the downlink port, and the second buffer volume threshold is less than the first buffer volume threshold.

In FIG. 6A and FIG. 6B and FIG. 8, the code block set including the first control code block is involved. In this embodiment of this application, the second code block stream may include a plurality of data units. In some cases, a data unit may also be referred to as a frame. The data unit or the frame is only used as a name in this embodiment of this application, and does not have another limitation meaning. As shown in FIG. 6B, one data unit includes the L code block sets and one code block set including at least the first control code block. As shown in FIG. 8, one data unit may include the P code block sets and one code block set including at least the first control code block.

In this embodiment of this application, the code block set including the first control code block is used to carry any one or more of the following content: indication information used to indicate the correspondence between the Q downlink ports and the S code block groups; indication information used to indicate a value of S; indication information used to indicate a value of L; indication information used to indicate the S code block groups; indication information used to indicate a sequence of the S code block groups in a code block set in the L code block sets; and indication information used to indicate a single buffer capacity.

For any one of the foregoing indication information, the indication information may be indicated in the code block set including the first control code block, and may be explicitly indicated by using some information, or may be implicitly indicated by using some information and a preset rule, or may be a default value (in one embodiment, the core device and the communications device each know the indication information even the indication information is not indicated).

In the indication information, for example, some predefined bits may be set in the code block set including the first control code block, and there is a correspondence between these bits and a code block group identifier. In other words, these bits may implicitly indicate the code block group identifier. If a port identifier is carried on these predefined bits, the port identifier on these predefined bits may indicate a correspondence between a port and a code block group. In this way, a data volume of the indication information can be reduced, and a port identifier corresponding to each code block does not need to be independently indicated. Alternatively, the correspondence between a port and a code block group may be indicated in another manner, and the code block set including the first control code block carries identifiers of the port and the code block group that have the correspondence.

In one embodiment, the second code block stream includes a plurality of data units, and one data unit includes one or more code block sets. Information carried in the code block set including the first control code block in a data unit may be information used to indicate L code block sets carried in the current data unit, or may be information used to indicate L code block sets carried in another data unit, or may be information used to indicate code block sets carried in the current data unit and another data unit.

For example, as shown in FIG. 6, the code block stream 301 may include a plurality of data units, and may further include a plurality of data units after the data unit 600. Any information carried in the code block set 607 in the data unit 600 may be information used to indicate the code blocks in the L code block sets 605 in the current data unit 600; or may be information used to indicate code blocks in a code block set in a subsequent data unit of the data unit 600 (for example, a next data unit of the data unit 600, or a next data unit of the next data unit of the data unit 600); or may be information used to indicate code block sets carried in the data unit 600 and a data unit in a time period subsequent to the data unit; or may be related information used to indicate code block sets in the data unit 600 and a plurality of subsequent consecutive data units that do not carry the first control code block.

An example in which the code block set including the first control code block carries the indication information used to indicate the correspondence between the Q downlink ports and the S code block groups is used for description. Because the ports are in a one-to-one correspondence with the code block streams, with reference to a sequence of the S code block groups in a code block set in the L code block sets, the indication information used to indicate the correspondence between the Q downlink ports and the S code block groups may also be described as indication information used to indicate a code block stream corresponding to a code block, from the first code block streams, carried in the second code block stream. Each first code block stream may be restored from the second code block stream by using the indication information. As shown in FIG. 6, the indication information that is carried in the code block set 607 in the data unit 600 and that is used to indicate the correspondence between the Q downlink ports and the S code block groups may be indication information used to indicate a first code block stream corresponding to each code block in the L code block sets 605 in the data unit 600; or may be indication information used to indicate a first code block stream corresponding to each code block, from the first code block stream, carried in a next data unit of the data unit 600; or may be indication information used to indicate a first code block stream corresponding to each code block, from the first code block stream, carried in the data unit 600 and a plurality of subsequent data units that do not include the first control code block.

The indication information used to indicate the correspondence between the Q downlink ports and the S code block groups may be used to indicate a correspondence between the Q downlink ports and the S code block groups in the uplink data process; or may be used to indicate a correspondence between the Q downlink ports and the S code block groups in the downlink data process; or is used to indicate a correspondence between the Q downlink ports and the S code block groups in the uplink data process and a correspondence between the Q downlink ports and the S code block groups in the downlink data process. In the following Table 1 and Table 2, an example in which a correspondence between a port and a code block group in the uplink data transmission process is consistent with that in the downlink data transmission process is used for description.

The indication information used to indicate the value of S may also be described as indication information used to indicate a total quantity of code block groups corresponding to code blocks, from the first code block streams, carried in one data unit (the data unit may be a current data unit carrying the indication information, or may be another data unit). One bit may be used to indicate the total quantity of code block groups corresponding to the code blocks, from the first code block streams, carried in the data unit. Alternatively, some predefined bits may be set in the code block set including the first control code block, and there is a correspondence between these bits and a code block group identifier. For example, for a code block group, when the second code block stream does not carry a code block corresponding to the code block group, a bit corresponding to the code block group is set to a preset value. For example, the bit corresponding to the code block group may be set to 0.

The indication information used to indicate the S code block groups may also be described as indication information used to indicate code block groups corresponding to code blocks, from the first code block streams, carried in one data unit (the data unit may be a current data unit carrying the indication information, or may be another data unit). Bits may be used to carry identifiers of the S code block groups, to indicate the code block groups corresponding to the code blocks, from the first code block streams, carried in the code block stream. Alternatively, some predefined bits may be set in the code block set including the first control code block, and there is a correspondence between these bits and a code block group identifier. For example, for a code block group, when the second code block stream does not carry a code block corresponding to the code block group, a bit corresponding to the code block group is set to a preset value. For example, the bit corresponding to the code block group may be set to 0.

The indication information used to indicate the value of L may also be described as indication information used to indicate a total quantity of code block sets corresponding to code blocks, from the first code block streams, included in one data unit (the data unit may be a current data unit carrying the indication information, or may be another data unit). One bit may be used to indicate the total quantity of code block sets corresponding to the code blocks, from the first code block streams, carried in the data unit. Alternatively, L may be set to a default value. For example, L is set to be equal to a quantity of code blocks that can be accommodated in a single buffer. The quantity of the code block sets corresponding to the code blocks, from the first code block streams, included in one data unit, the quantity of code block groups included in one code block set corresponding to the code blocks from the first code block streams, and a quantity of code blocks corresponding to one code block group in one code block set corresponding to the code blocks from the first code block streams may indicate a total length of the data unit. Because a physical rate of the port is a constant, these parameters may be used to represent a data length of one data unit, and one or more of the three parameters may be set to a default value.

The indication information used to indicate the sequence of the S code block groups in a code block set in the L code block sets may be described as indication information used to indicate a sequence of code block groups in a code block set corresponding to the code blocks, from the first code block streams, included in one data unit (the data unit may be a current data unit carrying the indication information, or may be another data unit). The indication information may be a default value. For example, the code block groups are sorted based on values of code block group identifiers by default.

The indication information used to indicate the single buffer capacity may be applied in the embodiment shown in FIG. 7. The indication information may be set to a default value.

The control code block in this embodiment of this application may have a plurality of structure forms, provided that information that needs to be indicated can be indicated. Table 1 shows an example of a possible structure form of the control code block according to an embodiment of this application. The control code block may be applicable to the first control code block to the ninth control code block mentioned in the foregoing content. Table 2 further shows an example of a structure form of another code block included in the code block set including the control code block. Table 2 is applicable to another code block in the code block set including the first control code block to another code block in the code block set including the ninth control code block mentioned in the foregoing content, for example, another code block in the code block set including the first control code block, another code block in the code block set including the second control code block, and another code block in the code block set including the third control code block. In Table 1 and Table 2, [A:B] represents a bit A to a bit B. For example, [65:64] represents a bit 65 to a bit 64.

TABLE 1

Structure form of the control code block

| Definition | Bit range occupied in a code block | Value | Remarks (content in this part is used to describe an example of a corresponding field) |
|---|---|---|---|
| Synchronization header | [65:64] | 10 | Setting the field to 10 indicates that the code block is a control code block, and setting the field to 01 indicates that the code block is a data code block. When a code block is a data code block, a value of a synchronization header area may be set to 01, and a subsequent bit is used to carry data. |
| Code block type | [63:56] | 0x4B | 0x4B is an example, and another value may be used. 0X4B indicates that a packet corresponding to the control code block is a special control packet. |
| Control (control) field | [55:51] | | The field may be set to different values to indicate different meanings. For example, setting the field to 0 may indicate that the control code block is used for an uplink request to |

TABLE 1-continued

Structure form of the control code block

| Definition | Bit range occupied in a code block | Value | Remarks (content in this part is used to describe an example of a corresponding field) |
|---|---|---|---|
| | | | request to allocate a code block group to a port; setting the field to 1 may indicate that the control code block is used for policy control, and for details, refer to the parameter field; setting the field to 2 may indicate that the control code block carries a mapping relationship between a port and a code block group; setting the field to 3 may indicate that the control code block is used to set a threshold (for example, a first buffer volume threshold and a second buffer volume threshold); setting the field to 4 may indicate that the control code block is used to apply for adding a code block group for a port; setting the field to 5 may indicate that the control code block is used to indicate that a subsequent data code block needs to be multicast; setting the field to 6 may indicate that the control code block is used to indicate that a subsequent data code block needs to be broadcast; setting the field to 7 may indicate that the control code block is used to instruct a communications device to report port information; setting the field to 7 may indicate that the control code block is used to indicate a value of L, where the value of L may also be described as a quantity L of code block sets corresponding to code blocks, from first code block streams, included in one data unit, and optionally, L is not greater than a quantity of code blocks that can be accommodated in a single buffer; setting the field to 9 may indicate that the control code block is used to instruct a communications device to report port information; setting the field to 0xA may indicate that a packet corresponding to the control code block is an uplink packet; setting the field to 0xB may indicate that a packet corresponding to the control code block is a downlink packet; and setting the field to 0xC may indicate that for a mapping relationship between a code block group and a port, refer to a nearest configuration. |
| Parameter (parameter) field | [50:48] | | When the $[0]^{th}$ bit in the control field is 1, setting a value of the $[2:0]^{th}$ bit in the parameter field to 0x0 may indicate that a communications device is not allowed to request to reconfigure a correspondence between a port and a code block group; and setting a value of the $[2:0]^{th}$ bit in the parameter field to 0x1 may indicate that the communications device is allowed to request to reconfigure a correspondence between a port and a code block group; and when the value of the control field is 7, if a value of the parameter field is 0, it may indicate that the communications device is a primary device, and if a value of the parameter field is 1, it may indicate that the communications device is a secondary device. |
| Correspondence between a code block group 1 and a port, and correspondence between a code block group 2 and a port | [47:32] | | When the value of the control field is 0 or 2, [47:40] may be used to identify the correspondence between a code block group 1 and a port, and [39:32] may be used to identify the correspondence between a code block group 2 and a port. For example, [47:40] = 0x02, indicating that the code block group 1 corresponds to the port 2. When the value of the control field is 4, [47:32] is used to identify a downlink port 1 to a downlink port 16. For example, the $47^{th}$ bit is identified by 1, indicating that a downlink port identified by the $47^{th}$ bit applies for increasing a bandwidth. When the value of the control field is 5, [47:32] is used to identify a downlink port 1 to a downlink port 16. For example, the $47^{th}$ bit is identified by 1, indicating that a downlink port identified by the $47^{th}$ bit has a multicast requirement. When the value of the control field is 7, [47:32] is used to identify a downlink port 1 to a downlink port 16. For example, the $47^{th}$ bit is identified by 1, indicating that a downlink port identified by the $47^{th}$ bit has a broadcast requirement. |
| Interface type | [31:28] | 0x1 | If a value of the field is 0x0, it may indicate that the interface type is Ethernet (Ethernet, ETH); if a value of the field is |

TABLE 1-continued

Structure form of the control code block

| Definition | Bit range occupied in a code block | Value | Remarks (content in this part is used to describe an example of a corresponding field) |
|---|---|---|---|
| Correspondence between a code block group 3 and a port, and correspondence between a code block group 4 and a port | [27:12] | | 0xf, it may indicate that the interface type is a fibre channel (Fibre Channel, FC); if a value of the field is 0x5, it may indicate that the interface type is FlexE; and if a value of the field is 0x1, it may indicate that the interface type is an applicable interface type in the embodiments of this application. [27:20] may be used to indicate the correspondence between a code block group 3 and a port, and [19:12] may be used to indicate the correspondence between a code block group 4 and a port. [27:12] may be further used to identify a downlink port 17 to a downlink port 32. An example related to the field is similar to the foregoing field used to indicate the correspondence between a code block group 1 and a port and the correspondence between a code block group 2 and a port, and is not further described by using an example. |
| Total quantity of code block groups included in one data unit | [11:5] | | The field is used to indicate the total quantity of code block groups included a one data unit, and may be further used to indicate a code block group that has a multicast or broadcast requirement. |
| Total quantity of code blocks that can be accommodated in a single buffer | [4:1] | | Because a port rate is constant, the parameter may alternatively be represented by using a time length. In other words, the field may fill a time for transmitting all the code blocks accommodated in the single buffer, and the parameter may use a unit of microsecond (us). In this embodiment of this application, optionally, the code block group may also be referred to as a time slice, the time slice is duration consumed by transmitting all code blocks that can be accommodated in one buffer, and the quantity of code block groups may also be referred to as a quantity of time slices. |
| End marker bit | [0] | | If the field is set to 1, it indicates that the code block set including the control code block includes only the control code block; and if the field is set to 0, it indicates that the code block set including the control code block includes another code block in addition to the control code block. |

TABLE 2

Structure form of another code block included in the code block set including the control code block

| Definition | Position | Value | Remarks |
|---|---|---|---|
| Synchronization header | [65:64] | | Setting the field to 10 indicates that the code block is a control code block, and setting the field to 01 indicates that the code block is a data code block. The field in the code block may be 10 or 01. |
| Code block type | [63:56] | 0xff | Setting the field to 0xff may indicate that the code block is the another code block included in the code block set including the control code block, and is used to indicate a correspondence between a port and a code block group. |
| Correspondence between a code block group and a port | [55:48] | | [55:48] is used to indicate a correspondence between a code block group 5 and a port, and may be further used to identify a downlink port 33 to a downlink port 40. |
| | [47:40] | | [47:40] is used to indicate a correspondence between a code block group 6 and a port, and may be further used to identify a downlink port 41 to a downlink port 48. |
| | [39:32] | | [39:32] is used to indicate a correspondence between a code block group 7 and a port, and may be further used to identify a downlink port 49 to a downlink port 56. |
| | [31:24] | | [31:24] is used to indicate a correspondence between a code block group 8 and a port, and may be further used to identify a downlink port 57 to a downlink port 64. |
| | [23:16] | | [23:16] is used to indicate a correspondence between a code block group 9 and a port, and may be further used to identify a downlink port 65 to a downlink port 72. |
| | [15:8] | | [15:8] is used to indicate a correspondence between a code block group 10 and a port, and may be further used to identify a downlink port 73 to a downlink port 80. |
| Device ID and end marker bit | [7:0] | 0x0 | When each value of the field is 0, it may indicate that the code block ends. The $1^{st}$ to $255^{th}$ bits of the $1^{st}$ field may correspond to device identifiers of the first to $255^{th}$ communications devices. An uplink port of a communications device is connected to a downlink port of an upper-level communications device, and an identifier of the communications device may be set, by default, to a port identifier of the downlink port, of the upper-level communications device, connected to the uplink port of the communications device. When the value of the control field in Table 1 is 9, a quantity of downlink ports of |

TABLE 2-continued

Structure form of another code block included in the code block set including the control code block

| Definition | Position | Value | Remarks |
|---|---|---|---|
| | | | the communications device may be identified by using the $1^{st}$ to $255^{th}$ bits. |

To be further compatible with the prior art, MAC encapsulation may be performed on a data unit generated in the embodiments of this application. For example, a MAC header (the MAC header may include fields such as a destination address, a source address, and a type number) and a MAC tail (the MAC tail may include a frame check sequence (FCS) field, and the like) are added. Therefore, the data unit is encapsulated as a standard MAC packet, for example, encapsulated as a 802.3 Ethernet packet. In this way, a MAC tunnel may be added between the communications devices used in the embodiments of this application. For example, the MAC tunnel is added between the first communications device and the second communications device. In this case, a data unit in a code block stream sent by the second communications device needs to be encapsulated as a MAC packet, to reach the second communications device through the MAC tunnel. In this case, the core device may allocate a MAC address to each communications device, to be used when the destination address and the source address of the MAC header are added. This embodiment may be further compatible with the prior art, and a third-party switch may be added between communications devices of an aggregation layer, an access layer, and a core layer. The third-party switch forwards a packet only based on the destination address (destination MAC address), and the third-party switch does not parse the data unit encapsulated in the MAC packet. The data unit inside the MAC packet is parsed only when a communications device (for example, the access device, the aggregation device, or the core device) in the embodiments of this application receives the MAC packet whose destination address is a MAC address of the communications device.

Currently, FLEXE is a PHY convergence technology. PHY convergence needs to transmit bytes by using ports alternately in a fixed or agreed-on sequence, and performs block-level reassembly on data to form a packet. If a current L2/L3 forwarding architecture is used, an address and a sequence label need to be allocated to each block, and then shared storage and forwarding are performed on the address and the sequence label. As a result, overheads are about 20% greater than an average payload, and efficiency is poor than MAC forwarding. Therefore, the solutions are infeasible. FIG. 3 shows an internal data process of the PHY convergence (FLEXE): Each piece of data has a fixed size, and successively enters different ports in a fixed sequence.

Figure 13:
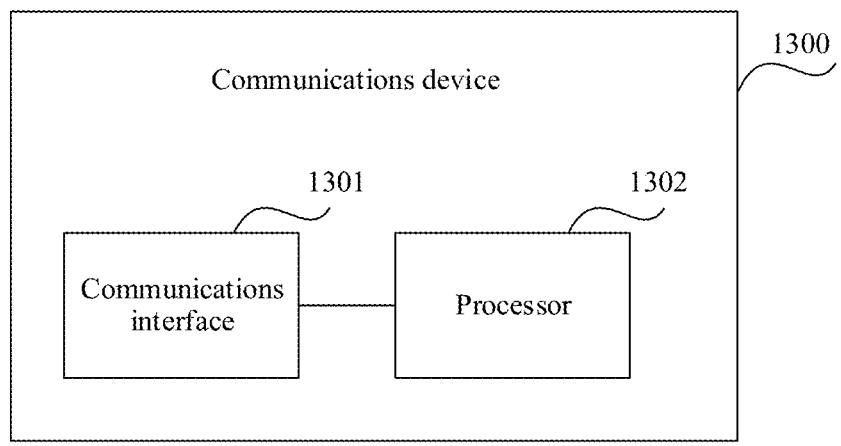
FIG. 13 is a schematic structural diagram of a communications device according to an embodiment of this application.

Based on the foregoing content and a same concept, this application provides a communications device 1300, configured to perform any one of the solutions on the multiplexing side and the demultiplexing side in the foregoing method. FIG. 13 is an example of a schematic structural diagram of a communications device according to this application. As shown in FIG. 13, the communications device 1300 includes a communications interface 1301 and a processor 1302. The communications device 1300 in this example may be the first communications device or the third communications device in the foregoing content.

The processor 1302 is a component that can perform a corresponding action. For example, the processor 1302 may be a central processing unit (CPU), a network processor (NP), or a combination of a CPU and an NP.

The processor 1302 in this embodiment of this application may alternatively be implemented by using a hardware chip. The foregoing hardware chip may be an application-specific integrated circuit (ASIC), a programmable logic device (PLD), or a combination thereof. The PLD may be a complex programmable logic device (CPLD), a field-programmable gate array (FPGA), generic array logic (GAL), or any combination thereof.

The communications interface 1301 may be a wired communications interface, a wireless communications interface, or a combination thereof. The wired communications interface may be, for example, an Ethernet interface. The Ethernet interface may be an optical interface, an electrical interface, or a combination thereof. The wireless communications interface may be a WLAN interface. The communications interface includes a downlink port and an uplink port of the communications device.

In one embodiment, in this embodiment of this application, a memory may be included, or may not be included. For example, when a function of the processor is implemented by using a hardware chip, the memory may not be included. When the memory is included, the memory may include a volatile memory, for example, a random access memory (RAM); or the memory may include a non-volatile memory, for example, a flash memory, a hard disk drive (HDD), or a solid-state drive (SSD); or the memory may include a combination of the foregoing types of memories.

In one embodiment, the processor 1302 may be configured to perform one or more operations or the embodiments shown in the foregoing solutions, to enable the communications device 1300 to implement functions of a communications device on the multiplexing side or the demultiplexing side in the foregoing method. When the memory exists, the memory may be further configured to store a program instruction, and the processor 1302 invokes the program instruction stored in the memory, and may perform one or more operations or the embodiments shown in the foregoing solutions, to enable the communications device 1300 to implement functions of a communications device on the multiplexing side or the demultiplexing side in the foregoing method.

When the communications device 1300 is configured to perform the solutions on the multiplexing side, the communications device 1300 may be configured to perform the solutions performed by the first communications device. The communications interface 1301 is configured to obtain Q first code block streams, where Q is an integer greater than 1, the communications interface 1301 includes at least Q downlink ports, the Q first code block streams are in a one-to-one correspondence with the Q downlink ports, the Q downlink ports correspond to S code block groups, one downlink port corresponds to one or more code block groups, one code block in the Q first code block streams corresponds to one code block group, and S is an integer not less than Q; and the processor 1302 is configured to obtain a to-be-sent second code block stream based on the Q first code block streams, where the second code block stream includes L code block sets; for each of the L code block sets, the code block set includes K code blocks corresponding to each of the S code block groups, and L and K are each a positive integer; and when the first communications device is not a core device, a value of S is a total quantity of code block groups corresponding to the Q downlink ports in an uplink data transmission process, and each of the S code block groups is a code block group corresponding to the Q downlink ports in the uplink data transmission process; or when the first communications device is a core device, a value of S is a total quantity of code block groups corresponding to the Q downlink ports in a downlink data transmission process, and each of the S code block groups is a code block group corresponding to the Q downlink ports in the downlink data transmission process.

When the communications device 1300 is configured to perform the solutions on the multiplexing side, the communications device 1300 may be configured to perform the solutions performed by the first communications device. The communications interface 1301 obtains Q first code block streams, where Q is an integer greater than 1; and the processor 1302 obtains a to-be-sent second code block stream based on the Q first code block streams, where for a code block, from the Q first code block streams, carried in the second code block stream, content carried in a synchronization header area of the code block in the second code block stream is the same as content carried in a synchronization header area of the code block in the Q first code block streams; and content carried in a non-synchronization header area of the code block in the second code block stream is the same as content carried in a non-synchronization header area of the code block in the Q first code block streams; and when the first communications device is not a core device, a value of S is a total quantity of code block groups corresponding to the Q downlink ports in an uplink data transmission process, and each of the S code block groups is a code block group corresponding to the Q downlink ports in the uplink data transmission process; or when the first communications device is a core device, a value of S is a total quantity of code block groups corresponding to the Q downlink ports in a downlink data transmission process, and each of the S code block groups is a code block group corresponding to the Q downlink ports in the downlink data transmission process.

When the communications device 1300 is configured to perform the solutions on the multiplexing side, in one embodiment, the processor 1302 is configured to cyclically perform a code block extraction operation for L times on the Q first code block streams, to obtain the second code block stream, where for each of the L code block extraction operations, the processor 1302 sequentially extracts, from the Q first code block streams based on a sequence of the S code block groups, the K code blocks corresponding to each of the S code block groups.

When the communications device 1300 is configured to perform the solutions on the multiplexing side, in one embodiment, the processor 1302 is configured to insert an idle idle code block into the second code block stream when no code block is extracted in a process of cyclically performing the code block extraction operation for L times.

When the communications device 1300 is configured to perform the solutions on the multiplexing side, in one embodiment, the S code block groups correspond to S buffers, and the S code block groups are in a one-to-one correspondence with the S buffers; and the processor 1302 is further configured to: buffer code blocks in the Q first code block streams to the S buffers based on a correspondence between the S code block groups and the S buffers; and sequentially extract K code blocks from each of the S buffers based on the sequence of the S code block groups.

When the communications device 1300 is configured to perform the solutions on the multiplexing side, in one embodiment, the processor 1302 is configured to: for a first code block stream in the Q first code block streams, when the first code block stream corresponds to one code block group, buffer code blocks in the first code block stream to a buffer corresponding to the code block group; or when the first code block stream corresponds to a plurality of code block groups, sequentially buffer code blocks in the first code block stream by turns to a plurality of buffers corresponding to the plurality of code block groups.

When the communications device 1300 is configured to perform the solutions on the multiplexing side, in one embodiment, the processor 1302 is configured to: for each code block in the Q first code block streams, discard the code block when a code block type of the code block is an idle idle code block.

When the communications device 1300 is configured to perform the solutions on the multiplexing side, in one embodiment, the communications interface 1301 is further configured to: receive a third code block stream sent by a core device, where a header and/or a tail of the third code block stream include/includes one code block set, the code block set includes at least one third control code block, and the code block set including the third control code block includes: indication information used to indicate a correspondence between a downlink port of the first communications device and a code block group in the uplink data transmission process, and/or indication information used to indicate a correspondence between a downlink port of the first communications device and a code block group in the downlink data transmission process.

When the communications device 1300 is configured to perform the solutions on the multiplexing side, in one embodiment, the communications device is connected to Q second communications devices by using the Q downlink ports, and the Q downlink ports are in a one-to-one correspondence with the Q second communications devices; the processor 1302 is further configured to demultiplex code blocks in the third code block stream other than the third control code block, to obtain Q fourth code block streams, where the Q fourth code block streams are in a one-to-one correspondence with the Q downlink ports; and the communications interface 1301 is configured to distribute the Q fourth code block streams by using the Q downlink ports, where for a fourth code block stream in the Q fourth code block streams, a header and/or a tail of the fourth code block stream include/includes one code block set, the code block set includes at least one fourth control code block, and the code block set including the fourth control code block includes: indication information used to indicate a correspondence between a code block group and a downlink port, of a second communications device, corresponding to the fourth code block stream in the uplink data transmission process, and/or indication information used to indicate a correspondence between a code block group and a downlink port, of a second communications device, corresponding to the fourth code block stream in the downlink data transmission process.

When the communications device 1300 is configured to perform the solutions on the demultiplexing side, the communications device 1300 may be configured to perform the solutions performed by the third communications device. The communications interface 1301 is configured to obtain a second code block stream, where the second code block stream includes L code block sets; for each of the L code block sets, the code block set includes K code blocks corresponding to each of S code block groups, one code block in the L code block sets corresponds to one code block group, S is an integer greater than 1, and L and K are each a positive integer; and the processor 1302 is configured to obtain Q first code block streams based on the second code block stream, where Q is an integer greater than 1 and not greater than S, the Q first code block streams correspond to the S code block groups, and one first code block stream corresponds to one or more code block groups; and when the third communications device is not a core device, a value of S is a total quantity of code block groups corresponding to the Q downlink ports in a downlink data transmission process, and each of the S code block groups is a code block group corresponding to the Q downlink ports in the downlink data transmission process; or when the first communications device is a core device, a value of S is a total quantity of code block groups corresponding to the Q downlink ports in an uplink data transmission process, and each of the S code block groups is a code block group corresponding to the Q downlink ports in the uplink data transmission process.

When the communications device 1300 is configured to perform the solutions on the demultiplexing side, the communications device 1300 may be configured to perform the solutions performed by the third communications device. The communications interface 1301 is configured to obtain a second code block stream; and the processor 1302 is configured to obtain Q first code block streams based on the second code block stream, where Q is an integer greater than 1; for a code block, from the Q first code block streams, carried in the second code block stream, content carried in a synchronization header area of the code block in the second code block stream is the same as content carried in a synchronization header area of the code block in the Q first code block streams; and content carried in a non-synchronization header area of the code block in the second code block stream is the same as content carried in a non-synchronization header area of the code block in the Q first code block streams; and when the third communications device is not a core device, a value of S is a total quantity of code block groups corresponding to the Q downlink ports in a downlink data transmission process, and each of the S code block groups is a code block group corresponding to the Q downlink ports in the downlink data transmission process; or when the third communications device is a core device, a value of S is a total quantity of code block groups corresponding to the Q downlink ports in an uplink data transmission process, and each of the S code block groups is a code block group corresponding to the Q downlink ports in the uplink data transmission process.

When the communications device 1300 is configured to perform the solutions on the demultiplexing side, in one embodiment, the processor 1302 is configured to: for each of the L code block sets, sequentially extract, from the code block set based on a sequence of the S code block groups, the K code blocks corresponding to each of the S code block groups, to obtain the Q first code block streams.

When the communications device 1300 is configured to perform the solutions on the demultiplexing side, in one embodiment, the S code block groups correspond to S buffers, and the S code block groups are in a one-to-one correspondence with the S buffers; and the processor 1302 is further configured to buffer the K code blocks corresponding to each of the S code block groups to a buffer corresponding to the code block group.

When the communications device 1300 is configured to perform the solutions on the demultiplexing side, in one embodiment, the second code block stream further includes one code block set in front of a header and/or behind a tail of the L code block sets, the code block set includes at least one first control code block, and the code block set including the first control code block includes indication information used to indicate a correspondence between the Q downlink ports of the communications device and the S code block groups; and the processor 1302 is configured to: obtain the correspondence between the Q downlink ports and the S code block groups based on the code block set including the first control code block; and demultiplex the L code block sets into the Q first code block streams based on the correspondence between the Q downlink ports and the S code block groups.

When the communications device 1300 is configured to perform the solutions on the demultiplexing side, in one embodiment, the communications device is connected to Q fourth communications devices by using the Q downlink ports, and the Q downlink ports are in a one-to-one correspondence with the Q fourth communications devices; and the communications interface 1301 is further configured to distribute the Q first code block streams by using the Q downlink ports, where a header and/or a tail of a first code block stream include/includes one code block set, the code block set includes at least one fifth control code block, and the code block set including the fifth control code block includes: indication information used to indicate a correspondence between a code block group and a downlink port, of a fourth communications device, corresponding to the first code block stream in the uplink data transmission process, and/or indication information used to indicate a correspondence between a code block group and a downlink port, of a fourth communications device, corresponding to the first code block stream in the downlink data transmission process.

When the communications device 1300 performs the solutions on the multiplexing side and the demultiplexing side, for other content such as related structure forms of the first code block stream and the second code block stream, refer to the content described in FIG. 2 to FIG. 12B. Details are not described herein again.

Figure 14:
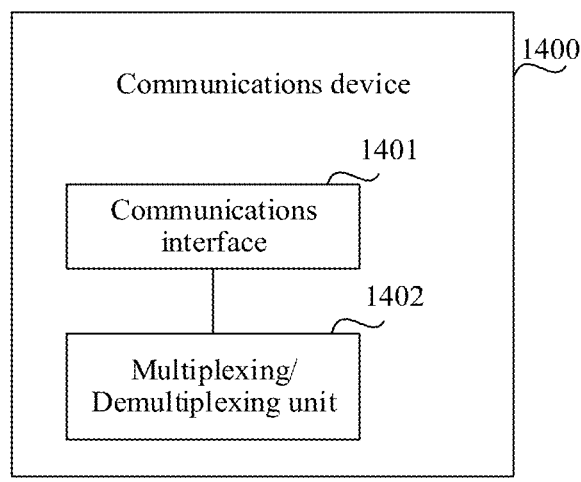
FIG. 14 is a schematic structural diagram of another communications device according to an embodiment of this application.

Based on the same concept, an embodiment of this application provides a communications device, configured to perform any one of the solutions on the multiplexing side and the demultiplexing side in the foregoing method procedure. FIG. 14 is an example of a schematic structural diagram of a communications device according to an embodiment of this application. As shown in FIG. 14, the communications device 1400 includes a communications interface 1401 and a multiplexing/demultiplexing unit 1402. The communications device 1400 in this example may be the first communications device or the third communications device in the foregoing content, and may perform the solutions corresponding to FIG. 5, FIG. 6, FIG. 9, and FIG. 10.

When the communications device 1400 is configured to perform the solutions on the multiplexing side, the communications device 1400 may be configured to perform the solutions performed by the first communications device. The communications interface 1401 is configured to obtain Q first code block streams, where Q is an integer greater than 1, the communications interface includes at least Q downlink ports, the Q first code block streams are in a one-to-one correspondence with the Q downlink ports, the Q downlink ports correspond to S code block groups, one downlink port corresponds to one or more code block groups, one code block in the Q first code block streams corresponds to one code block group, and S is an integer not less than Q; and the multiplexing/demultiplexing unit 1402 is configured to obtain a to-be-sent second code block stream based on the Q first code block streams, where the second code block stream includes L code block sets; for each of the L code block sets, the code block set includes K code blocks corresponding to each of the S code block groups, and L and K are each a positive integer; and when the communications device 1400 is not a core device, a value of S is a total quantity of code block groups corresponding to the Q downlink ports in an uplink data transmission process, and each of the S code block groups is a code block group corresponding to the Q downlink ports in the uplink data transmission process; or when the communications device 1400 is a core device, a value of S is a total quantity of code block groups corresponding to the Q downlink ports in a downlink data transmission process, and each of the S code block groups is a code block group corresponding to the Q downlink ports in the downlink data transmission process.

When the communications device 1400 is configured to perform the solutions on the multiplexing side, the communications device 1400 may be configured to perform the solutions performed by the first communications device. The communications interface 1401 is configured to obtain Q first code block streams, where Q is an integer greater than 1; and the processor 1402 is configured to obtain a to-be-sent second code block stream based on the Q first code block streams, where for a code block, from the Q first code block streams, carried in the second code block stream, content carried in a synchronization header area of the code block in the second code block stream is the same as content carried in a synchronization header area of the code block in the Q first code block streams; and content carried in a non-synchronization header area of the code block in the second code block stream is the same as content carried in a non-synchronization header area of the code block in the Q first code block streams; and when the communications device 1400 is not a core device, a value of S is a total quantity of code block groups corresponding to the Q downlink ports in an uplink data transmission process, and each of the S code block groups is a code block group corresponding to the Q downlink ports in the uplink data transmission process; or when the communications device 1400 is a core device, a value of S is a total quantity of code block groups corresponding to the Q downlink ports in a downlink data transmission process, and each of the S code block groups is a code block group corresponding to the Q downlink ports in the downlink data transmission process.

When the communications device 1400 is configured to perform the solutions on the demultiplexing side, the communications device 1400 may be configured to perform the solutions performed by the third communications device. The communications interface 1401 is configured to obtain a second code block stream, where the second code block stream includes L code block sets; for each of the L code block sets, the code block set includes K code blocks corresponding to each of S code block groups, one code block in the L code block sets corresponds to one code block group, S is an integer greater than 1, and L and K are each a positive integer; and the multiplexing/demultiplexing unit 1402 is configured to obtain Q first code block streams based on the second code block stream, where Q is an integer greater than 1 and not greater than S, the Q first code block streams correspond to the S code block groups, and one first code block stream corresponds to one or more code block groups; and when the communications device is not a core device, a value of S is a total quantity of code block groups corresponding to the Q downlink ports in a downlink data transmission process, and each of the S code block groups is a code block group corresponding to the Q downlink ports in the downlink data transmission process; or when the communications device is a core device, a value of S is a total quantity of code block groups corresponding to the Q downlink ports in an uplink data transmission process, and each of the S code block groups is a code block group corresponding to the Q downlink ports in the uplink data transmission process.

When the communications device 1400 is configured to perform the solutions on the demultiplexing side, the communications device 1400 may be configured to perform the solutions performed by the third communications device. The communications interface 1401 is configured to obtain a second code block stream; and the multiplexing/demultiplexing unit 1402 is configured to obtain Q first code block streams based on the second code block stream, where Q is an integer greater than 1; for a code block, from the Q first code block streams, carried in the second code block stream, content carried in a synchronization header area of the code block in the second code block stream is the same as content carried in a synchronization header area of the code block in the Q first code block streams; and content carried in a non-synchronization header area of the code block in the second code block stream is the same as content carried in a non-synchronization header area of the code block in the Q first code block streams; and when the communications device is not a core device, a value of S is a total quantity of code block groups corresponding to the Q downlink ports in a downlink data transmission process, and each of the S code block groups is a code block group corresponding to the Q downlink ports in the downlink data transmission process; or when the communications device is a core device, a value of S is a total quantity of code block groups corresponding to the Q downlink ports in an uplink data transmission process, and each of the S code block groups is a code block group corresponding to the Q downlink ports in the uplink data transmission process.

It should be understood that, division of units of the first communications device and the second communications device is merely logical function division. The units may be all or partially integrated in a physical entity or may be separated physically in an actual implementation. In this embodiment of this application, the communications interface 1401 may be implemented by using the communications interface 1301 in FIG. 13, and the multiplexing/demultiplexing unit 1402 may be implemented by using the processor 1302 in FIG. 13. In one embodiment, the communications interface 1401 in this embodiment of this application may perform the solutions performed by the communications interface 1301 in FIG. 13. The multiplexing/demultiplexing unit 1402 in this embodiment of this application may perform the solutions performed by the processor 1302 in FIG. 13. For other content, refer to the foregoing content. Details are not described herein again.

An embodiment of this application further provides a computer-readable medium. The computer-readable medium stores a computer program. When the computer program is executed by a computer, the data transmission method in any one of the foregoing method embodiments is implemented.

An embodiment of this application further provides a computer program product. When the computer program product is executed by a computer, the data transmission method in any one of the foregoing method embodiments is implemented.

In the foregoing embodiments, all or some of the functions may be implemented by using software, hardware, or any combination thereof. When being implemented by using software program, all or some of the functions may be implemented in a form of a computer program product. The computer program product includes one or more instructions. When the computer program instructions are loaded and executed on the computer, the procedure or functions according to the embodiments of this application are all or partially generated. The computer may be a general-purpose computer, a dedicated computer, a computer network, or other programmable apparatuses. The instructions may be stored in a computer storage medium or may be transmitted from a computer storage medium to another computer-readable storage medium. For example, the instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer storage medium may be any usable medium accessible by a computer, or a data storage device, such as a server or a data center, integrating one or more usable media. The usable medium may be a magnetic medium (for example, a soft disk, a hard disk, or a magnetic tape, a magneto-optical disk (MO)), an optical medium (for example, a CD, a DVD, a BD, an HVD), a semiconductor medium (for example, a ROM, an EPROM, an EEPROM, a non-volatile memory (NAND FLASH), a Solid State Disk, SSD), or the like.

A person skilled in the art should understand that the embodiments of this application may be provided as a method, a system, or a computer program product. Therefore, the embodiments of this application may use a form of hardware only embodiments, software only embodiments, or embodiments with a combination of software and hardware. Moreover, the embodiments of this application may use a form of a computer program product that is implemented on one or more computer-usable storage media (including but not limited to a disk memory, a CD-ROM, an optical memory, and the like) that include computer-usable program code.

The embodiments of this application are described with reference to the flowcharts and/or block diagrams of the method, the device, system, and the computer program product according to the embodiments of this application. It should be understood that instructions may be used to implement each process and/or each block in the flowcharts and/or the block diagrams and a combination of a process and/or a block in the flowcharts and/or the block diagrams. These instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a function in one or more processes in the flowcharts and/or in one or more blocks in the block diagrams.

These computer program instructions may be stored in a computer readable memory that can instruct the computer or any other programmable data processing device to work in a manner, so that the instructions stored in the computer readable memory generate an artifact that includes an instruction apparatus. The instruction apparatus implements a function in one or more processes in the flowcharts and/or in one or more blocks in the block diagrams.

These instructions may be loaded onto a computer or another programmable data processing device, so that a series of operations and steps are performed on the computer or the another programmable device, thereby generating computer-implemented processing. Therefore, the instructions executed on the computer or the another programmable device provide operations for implementing a function in one or more processes in the flowcharts and/or in one or more blocks in the block diagrams.

Obviously, a person skilled in the art can make various modifications and variations to embodiments of this application without departing from the spirit and scope of this application. This application is intended to cover these modifications and variations provided that they fall within the scope of protection defined by the following claims and their equivalent technologies.

What is claimed is:

1. A data transmission method comprising:
    obtaining, by a first communications device, Q first code block streams, wherein Q is an integer greater than 1, the Q first code block streams are in a one-to-one correspondence with Q downlink ports, the Q downlink ports correspond to S code block groups, one downlink port corresponds to one or more code block groups, one code block in the Q first code block streams corresponds to one code block group, and S is an integer not less than Q; and
    obtaining, by the first communications device, a to-be-sent second code block stream based on the Q first code block streams, wherein the second code block stream comprises L code block sets, and, for each of the L code block sets, the code block set comprises K code blocks corresponding to each of the S code block groups, and L and K are each a positive integer,
    wherein after the obtaining, by the first communications device, the Q first code block streams, and before the obtaining the to-be-sent second code block stream based on the Q first code block streams, the method further comprises:
    for a code block in the Q first code block streams, discarding, by the first communications device, the code block when a code block type of the code block is an idle code block.

2. The method according to claim 1, wherein for a code block in the L code block sets,
    content carried in a synchronization header area of the code block in the second code block stream is the same as content carried in a synchronization header area of the code block in the Q first code block streams; and
    content carried in a non-synchronization header area of the code block in the second code block stream is the same as content carried in a non-synchronization header area of the code block in the Q first code block streams.

3. The method according to claim 1, wherein code blocks in the L code block sets are consecutively carried in the second code block stream; and
    the second code block stream further comprises one code block set in front of a header and/or behind a tail of the L code block sets, a header of the code block set comprises at least one first control code block, and the code block set comprising the first control code block is used to carry any one or more of the following content:
    indication information used to indicate a correspondence between the Q downlink ports and the S code block groups;
    indication information used to indicate a value of S;
    indication information used to indicate a value of L;
    indication information used to indicate the S code block groups; and indication information used to indicate a sequence of the S code block groups in a code block set in the L code block sets.

4. The method according to claim 1, wherein the obtaining, by the first communications device, the to-be-sent second code block stream based on the Q first code block streams comprises:
cyclically performing, by the first communications device, a code block extraction operation for L times on the Q first code block streams, to obtain the second code block stream, wherein,
for each of the L code block extraction operations, the first communications device sequentially extracts, from the Q first code block streams based on a sequence of the S code block groups, the K code blocks corresponding to each of the S code block groups.

5. The method according to claim 4, wherein the S code block groups correspond to S buffers, and the S code block groups are in a one-to-one correspondence with the S buffers; and
after the obtaining, by the first communications device, the Q first code block streams, and before the obtaining the to-be-sent second code block stream based on the Q first code block streams, the method further comprises:
buffering, by the first communications device, code blocks in the Q first code block streams to the S buffers based on a correspondence between the S code block groups and the S buffers, and the first communications device sequentially extracts, from the Q first code block streams based on the sequence of the S code block groups, the K code blocks corresponding to each of the S code block groups comprising:
sequentially extracting, by the first communications device, K code blocks from each of the S buffers based on the sequence of the S code block groups.

6. The method according to claim 1, wherein before the obtaining, by the first communications device, the Q first code block streams, the method further comprises:
receiving, by the first communications device, a third code block stream sent by a core device, wherein a header and/or a tail of the third code block stream comprises one code block set, the code block set comprises at least one third control code block, and the code block set comprising the third control code block comprises: indication information used to indicate a correspondence between a downlink port of the first communications device and a code block group in an uplink data transmission process, and/or indication information used to indicate a correspondence between a downlink port of the first communications device and a code block group in a downlink data transmission process.

7. The method according to claim 6, wherein the first communications device is connected to Q second communications devices by using the Q downlink ports, and the Q downlink ports are in a one-to-one correspondence with the Q second communications devices; and
after the receiving, by the first communications device, a third code block stream sent by a core device, the method further comprises:
demultiplexing, by the first communications device, code blocks in the third code block stream other than the third control code block, to obtain Q fourth code block streams, wherein the Q fourth code block streams are in a one-to-one correspondence with the Q downlink ports; and distributing, by the first communications device, the Q fourth code block streams by using the Q downlink ports, wherein for a fourth code block stream in the Q fourth code block streams, a header and/or a tail of the fourth code block stream comprises one code block set, the code block set comprises at least one fourth control code block, and the code block set comprising the fourth control code block comprises: indication information used to indicate a correspondence between a code block group and a downlink port, of a second communications device, corresponding to the fourth code block stream in the uplink data transmission process, and/or indication information used to indicate a correspondence between a code block group and a downlink port, of a second communications device, corresponding to the fourth code block stream in the downlink data transmission process.

8. A communications device comprising:
a communications interface configured to obtain Q first code block streams, wherein Q is an integer greater than 1, the communications interface comprises at least Q downlink ports, the Q first code block streams are in a one-to-one correspondence with the Q downlink ports, the Q downlink ports correspond to S code block groups, one downlink port corresponds to one or more code block groups, one code block in the Q first code block streams corresponds to one code block group, and S is an integer not less than Q; and
a processor configured to obtain a to-be-sent second code block stream based on the Q first code block streams, wherein the second code block stream comprises L code block sets, and, for each of the L code block sets, the code block set comprises K code blocks corresponding to each of the S code block groups, and L and K are each a positive integer,
wherein the processor is further configured to:
for each code block in the Q first code block streams, discard the code block when a code block type of the code block is an idle code block.

9. The communications device according to claim 8, wherein for a code block in the L code block sets,
content carried in a synchronization header area of the code block in the second code block stream is the same as content carried in a synchronization header area of the code block in the Q first code block streams, and, content carried in a non-synchronization header area of the code block in the second code block stream is the same as content carried in a non-synchronization header area of the code block in the Q first code block streams.

10. The communications device according to claim 8, wherein code blocks in the L code block sets are consecutively carried in the second code block stream; and
the second code block stream further comprises one code block set in front of a header and/or behind a tail of the L code block sets, a header of the code block set comprises at least one first control code block, and the code block set comprising the first control code block is used to carry any one or more of the following content:
indication information used to indicate a correspondence between the Q downlink ports and the S code block groups;
indication information used to indicate a value of S;
indication information used to indicate a value of L;
indication information used to indicate the S code block groups; and indication information used to indicate a sequence of the S code block groups in a code block set in the L code block sets.

11. The communications device according to claim 8, wherein the processor is configured to:
cyclically perform a code block extraction operation for L times on the Q first code block streams, to obtain the second code block stream, wherein
for each of the L code block extraction operations, the processor sequentially extracts, from the Q first code block streams based on a sequence of the S code block groups, the K code blocks corresponding to each of the S code block groups.

12. The communications device according to claim 11, wherein the S code block groups correspond to S buffers, and the S code block groups are in a one-to-one correspondence with the S buffers; and
the processor is further configured to:
buffer code blocks in the Q first code block streams to the S buffers based on a correspondence between the S code block groups and the S buffers; and
sequentially extract K code blocks from each of the S buffers based on the sequence of the S code block groups.

13. The communications device according to claim 8, wherein when R code block groups in the S code block groups meet a preset condition, and the second code block stream further comprises P code block sets, wherein
P is a positive integer, and for each of the P code block sets, the code block set comprises K code blocks corresponding to each of (S−R) code block groups;
R is a positive integer not greater than S, and the (S−R) code block groups are code block groups in the S code block groups other than the R code block groups; and
a code block group in the R code block groups meets the preset condition means that K*L consecutive code blocks corresponding to the code block group are idle code blocks.

14. The communications device according to claim 8, wherein the communications interface is further configured to:
receive a third code block stream sent by a core device, wherein a header and/or a tail of the third code block stream comprises one code block set, the code block set comprises at least one third control code block, and the code block set comprising the third control code block comprises: indication information used to indicate a correspondence between a downlink port of the communications device and a code block group in an uplink data transmission process, and/or indication information used to indicate a correspondence between a downlink port of the communications device and a code block group in a downlink data transmission process.

15. The communications device according to claim 14, wherein the communications device is connected to Q second communications devices by using the Q downlink ports, and the Q downlink ports are in a one-to-one correspondence with the Q second communications devices;
the processor is further configured to:
demultiplex code blocks in the third code block stream other than the third control code block, to obtain Q fourth code block streams, wherein the Q fourth code block streams are in a one-to-one correspondence with the Q downlink ports; and the communications interface is configured to:
distribute the Q fourth code block streams by using the Q downlink ports, wherein for a fourth code block stream in the Q fourth code block streams, a header and/or a tail of the fourth code block stream comprises one code block set, the code block set comprises at least one fourth control code block, and the code block set comprising the fourth control code block comprises: indication information used to indicate a correspondence between a code block group and a downlink port, of a second communications device, corresponding to the fourth code block stream in the uplink data transmission process, and/or indication information used to indicate a correspondence between a code block group and a downlink port, of a second communications device, corresponding to the fourth code block stream in the downlink data transmission process.

16. A communications device comprising:
a communications interface configured to obtain a second code block stream, wherein the second code block stream comprises L code block sets, and for each of the L code block sets, the code block set comprises K code blocks corresponding to each of S code block groups, one code block in the L code block sets corresponds to one code block group, S is an integer greater than 1, and L and K are each a positive integer; and
a processor configured to obtain Q first code block streams based on the second code block stream, wherein Q is an integer greater than 1 and not greater than S, the Q first code block streams correspond to the S code block groups, and one first code block stream corresponds to one or more code block groups,
wherein the processor is further configured to:
for each code block in the Q first code block streams, discard the code block when a code block type of the code block is an idle code block.

17. The communications device according to claim 16, wherein for a code block in the L code block sets,
content carried in a synchronization header area of the code block in the second code block stream is the same as content carried in a synchronization header area of the code block in the Q first code block streams and, content carried in a non-synchronization header area of the code block in the second code block stream is the same as content carried in a non-synchronization header area of the code block in the Q first code block streams.

18. The communications device according to claim 17, wherein code blocks in the L code block sets are consecutively carried in the second code block stream; and
the second code block stream further comprises one code block set in front of a header and/or behind a tail of the L code block sets, a header of the code block set comprises at least one first control code block, and the code block set comprising the first control code block is used to carry any one or more of the following content:
indication information used to indicate a correspondence between Q downlink ports and the S code block groups, wherein the communications interface comprises at least the Q downlink ports, and the Q downlink ports are in a one-to-one correspondence with the Q first code block streams;
indication information used to indicate a value of S;
indication information used to indicate a value of L;
indication information used to indicate the S code block groups; and indication information used to indicate a sequence of the S code block groups in a code block set in the L code block sets.

\* \* \* \* \*